United States Patent [19]

Hiroki

[11] Patent Number: 5,841,799
[45] Date of Patent: Nov. 24, 1998

[54] SEMICONDUCTOR LASER, MODULATION METHOD THEREFOR AND OPTICAL COMMUNICATION SYSTEM USING THE SAME

[75] Inventor: Tamayo Hiroki, Zama, Japan

[73] Assignee: Canon Kabushiki Kaisha, Tokyo, Japan

[21] Appl. No.: 570,654

[22] Filed: Dec. 11, 1995

[30] Foreign Application Priority Data

Dec. 17, 1994 [JP] Japan .................................. 6-334063
Dec. 17, 1994 [JP] Japan .................................. 6-334064
Dec. 17, 1994 [JP] Japan .................................. 6-334065

[51] Int. Cl.$^6$ ...................................................... H01S 3/10
[52] U.S. Cl. .............................. 372/19; 372/26; 372/27; 372/50; 372/96
[58] Field of Search ................................ 372/27, 50, 26, 372/96, 19, 20

[56] References Cited

U.S. PATENT DOCUMENTS 5,586,131  12/1996  Ono et al. .................................. 372/19
5,699,373  12/1997  Uchida et al. ............................. 372/27

FOREIGN PATENT DOCUMENTS 62-42593   2/1987  Japan .
159671     6/1990  Japan .

OTHER PUBLICATIONS

Electronics Letters, vol. 27, No. 18, Aug. 29, 1991, pp. 1680–1682, Klehr, et al., "Ultrafast Polarisation Switching in Ridge–Waveguide Laser Diodes".
Patent Abstracts of Japan, vol. 014, No. 414, Sep. 7, 1990 JP-A-02 159671.
Applied Physics Letters, vol. 60, No. 19, May 11, 1992, pp. 2321–2323, V. Jayaraman, et al., "Demonstration of Broadband Tunability in a Semiconductor Laser Using Sampled Gratings".
IEEE Photonics Technology Letters, vol. 2, No. 2, Feb. 1, 1990, pp. 139–142, H. Kobrinski, et al., "Simultaneous Fast Wavelength Switching and Intensity Modulation Using a Tunable DBR Laser".
Applied Physics Letters, vol. 64, No. 2, Jan. 10, 1994, pp. 158–160, H. Tanaka, et al., "Highly Efficient TE/TM Mode Switching of GAASP/ALGAAS Strained Quantum–Well Laser Diodes".
IEEE Journal of Quantum Electronics, vol. 27, No. 7, Jul. 1991, pp. 1874–1885, Y. Hori, et al., "Analysis of TE and TM Modes in DFB Lasers By Two–Dimensional Theory".
V. Jayaraman, "Demonstration of broadband tunability in a semiconductor laser using sampled gratings," 60 Appl. Phys. Lett. 2321–23 (May, 1992).
F. Kano, et al., "Broad Range Wavelength Tuning in DBR Lasers with Super Structure Grating (SSG)," Electronics Information Communication Technology, OQE 92–131, pp. 39–44 (Nov., 1992).

Primary Examiner—James W. Davie
Attorney, Agent, or Firm—Fitzpatrick, Cella, Harper & Scinto

[57] ABSTRACT

A semiconductor laser of the present invention includes a semiconductor laser structure having a waveguide extending along a resonance direction, an active layer provided at least partly in the waveguide, and a control unit for controlling the excited state of the semiconductor laser structure to change the relationship between wavelengths or propagation constants and threshold gains for transverse electric (TE) mode and transverse magnetic (TM) mode of the laser structure. The waveguide is designed such that threshold gains for the TE mode and the TM mode can be alternately made minimum under the control of the control unit.

34 Claims, 23 Drawing Sheets

FIG.6A
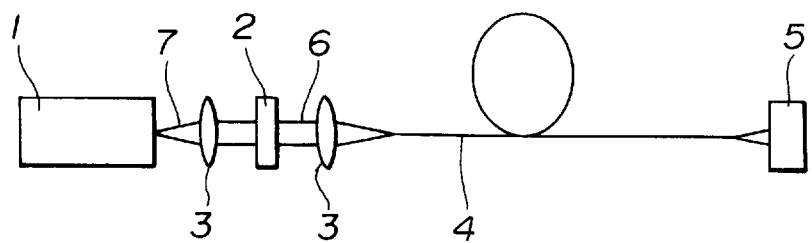
FIG.6B
FIG.6C
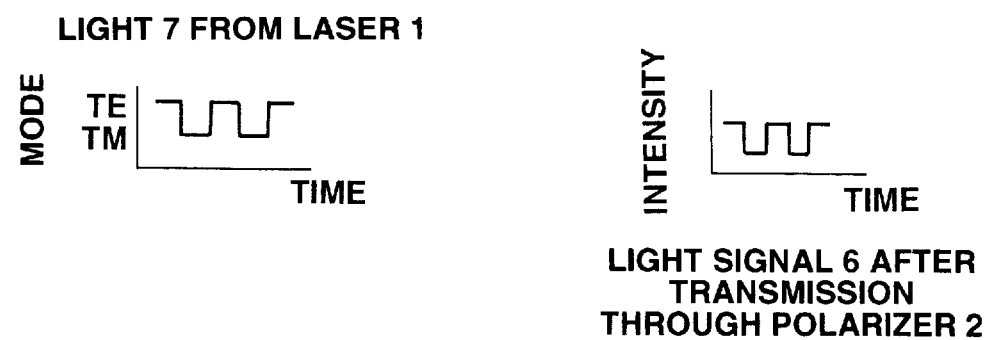

LIGHT SIGNAL 7'
FOR LASER

SIGNAL 6' AFTER TRANSMISSION
THROUGH FILTER

CHARACTERISTIC OF
RECEIVING FILTER

SEMICONDUCTOR LASER, MODULATION METHOD THEREFOR AND OPTICAL COMMUNICATION SYSTEM USING THE SAME

BACKGROUND OF THE INVENTION

1. Field of the Invention

The present invention relates to a semiconductor laser for use in the fields of optical communication systems, such as optical local area (LAN) networks, optical information processing, optical recording and the like, an optical transmitter including the semiconductor laser, a modulation method for modulating or driving the semiconductor laser and an optical communication system using the semiconductor laser as a transmitter.

2. Related Background Art

A prior art device is illustrated in FIGS. 1A and 1B (see Japanese Patent Laid-open No. 62-42593. In the prior art device, an n-type InGaAsP guide layer 2119, an InGaAsP active layer 2120, a p-type InP clad layer 2121 and a p-type InGaAsP contact layer 2122 are deposited on an n-type InP substrate 2111. A stripe-shaped mesa structure is formed, and the mesa structure is buried in a layer structure of a p-type InP 2112, an n-type InP 2113 and an n-type InGaAsP 2114. Along the guide layer 2119, there is formed a corrugation whose depth D is from 50 nm to 150 nm and whose pitch is 400 nm. The length LL of a cavity or resonator in a longitudinal direction is set to 400 µm. Further, coatings 2118 of $Al_2O_3$ are provided on end facets of the device to eliminate light reflection thereat. Reference numeral 2115 designates an insulating layer of $SiO_2$, and reference numerals 2116 and 2117 respectively designate p-type and n-type electrodes.

In such a distributed feedback (DFB) laser, magnitudes of gains for transverse electric (TE) and transverse magnetic (TM) polarization modes are made approximately equal to each other, and hence the device can oscillate either in the TE mode or in the TM mode. When current injected into the device is changed or modulated, the oscillation polarization mode is switched between the TE mode and the TM mode. In the laser described above, when a bias current is set at a magnitude a little less than a magnitude that enables the switching from the TE mode to the TM mode and a minute modulation current is superposed on the bias current, oscillation switching between the TE mode and the TM mode occurs. The thus-modulated light from the device is passed through a polarizer which is adjusted to select only light in one of the TE mode and the TM mode. Thus, modulation at high speed and with a high extinction ratio can be attained.

In a DFB laser as shown in FIG. 1, however, since threshold currents are substantially equal to each other at two wavelengths on both sides of the Bragg wavelength, its behavior becomes unstable and complicated due to destabilizing factors, such as residual reflection at the end facet and the phase of the grating at the end facet. Accordingly, the bias point of the device is difficult to find when the modulation is to be performed, and yield of a TE/TM tunable device is poor. Furthermore, there is the problem that the mode hopping is intricate and hence the oscillation wavelength control is difficult, when the device is used as a wavelength tunable light source.

Further, in an ordinary prior art DFB laser, characteristics of individual devices differ from each other due to differences in effective indices of the waveguide, internal gains, Bragg wavelengths and the like for TE and TM polarization modes. Also for those reasons, the behavior becomes unstable and complicated.

SUMMARY OF THE INVENTION

It is an object of the present invention to provide a semiconductor laser and so forth which can solve the above problems and to provide a semiconductor laser for use in the fields of optical communication systems such as optical local area (LAN) networks, optical information processing, optical recording and the like, an optical transmitter including the semiconductor laser, a modulation method for driving the semiconductor laser and an optical communication method and system using the semiconductor laser.

The object of the present invention is achieved by the following semiconductor laser, optical communication method and system, and transmitter.

According to one aspect of the present invention, there is provided a semiconductor laser which includes a semiconductor laser structure having a waveguide extending along a resonance direction, an active layer provided at least partly in the waveguide, and a control unit for controlling the excited state of the semiconductor laser structure to change the relationship between wavelengths or propagation constants (a relation between wavelength λ and propagation constant β is $β=2πn/λ$; n being the effective refractive index) and threshold gains for transverse electric (TE) mode and transverse magnetic (TM) mode of the laser structure. The waveguide is designed such that threshold gains for the TE mode and the TM mode alternately become minimum under the control of the control unit.

According to another aspect of the present invention, there is provided a semiconductor laser in which, in addition to the above structure, there is arranged a reflector in the waveguide along the resonance direction, and the reflector has reflection spectral characteristics that a plurality of high reflection peaks (the threshold gain is low at the high reflection peak) periodically exist on both sides of a predetermined wavelength and a wavelength difference exists between center wavelengths of reflection spectra for the TE mode and the TM mode.

The following structures may be adopted.

Gains for the TE mode and the TM mode may be made substantially equal to each other. The reflector may include a sampled grating in which a portion with a grating and a portion without a grating are periodically arranged alternately. The wavelength difference between the center wavelengths of reflection spectra for the TE mode and the TM mode may be approximately equal to a half of a wavelength difference between adjacent high reflection peaks for one of the TE mode and the TM mode. A difference between effective refractive indices of the waveguide for the TE mode and the TM mode may be set such that the wavelength difference between the center wavelengths of reflection spectra for the TE mode and the TM mode is approximately equal to a half of a wavelength difference between adjacent high reflection peaks for one of the TE mode and the TM mode. The active layer may include a bulk layer. There may be arranged a plurality of electrically-separated regions along the resonance direction, and different kinds of reflectors are respectively arranged in the regions such that intervals between the high reflection peak wavelengths in the regions are slightly different from each other and that different oscillation polarization modes can be selected one after another due to bernier effect between the different reflectors. There may be arranged a plurality of electrically-separated regions along the resonance direction, and at least one region has a phase control region for only controlling the phase of a light wave propagated along the waveguide, which lacks an active layer. The active layer may include a strained quantum well structure into which a coaxial tensile strain is introduced.

According to still another aspect of the present invention, there is provided a semiconductor laser in which there are arranged a plurality of electrically-separated regions along the resonance direction to form a distributed feedback semiconductor laser with a diffraction grating formed along the waveguide, and a difference exists between phase displacement amounts in the waveguide at places close to Bragg wavelengths for the TE mode and the TM mode. In other words, a difference exists between phase displacement amounts of one round-trip of light in the TE mode and the TM mode.

The following structures may be adopted.

The difference between the phase displacement amounts may be approximately equal to π. At least one region may include a phase control region for only controlling the phase of a light wave propagated along the waveguide, which lacks an active layer. A difference between phase displacement amounts in the phase control region at places close to Bragg wavelengths for the TE mode and the TM mode may be approximately equal to π. At least one region may have an active region which includes the active layer, and the following relation is established in the waveguide:

$$n_{2TE}/n_{1TE} - n_{2TM}/n_{1TM} \approx \Lambda/2L$$

where $n_{1TE}$ is the effective refractive index in the active region at a place close to Bragg wavelength for the TE mode, $n_{1TM}$ is the effective refractive index in said active region at a place close to Bragg wavelength for the TM mode, $n_{2TE}$ is the effective refractive index in the phase control region at a place close to Bragg wavelength for the TE mode, $n_{2TM}$ is the effective refractive index in the phase control region at a place close to Bragg wavelength for the TM mode, $\Lambda$ is the pitch of the diffraction grating, and L is the length of the phase control region. The active layer may comprise a bulk layer. The active layer may include a strained quantum well structure into which a coaxial tensile strain is introduced.

According to still another aspect of the present invention, there is provided a semiconductor laser in which there are arranged a plurality of electrically-separated regions along the resonance direction to form a distributed feedback semiconductor laser with a diffraction grating, and a difference, which is smaller than an interval between adjacent longitudinal modes of one of the TE mode and the TM mode, exists between Bragg wavelengths for the TE mode and the TM mode. In other words, each longitudinal mode of the TM mode is located between adjacent longitudinal modes of the TE mode.

The following structures may be adopted.

The difference between Bragg wavelengths for the TE mode and the TM mode may be approximately equal to a half of the interval between adjacent longitudinal modes of one of the TE mode and the TM mode. A difference between effective refractive indices for the TE mode and the TM mode may be set such that the difference between Bragg wavelengths for the TE mode and the TM mode is approximately equal to a half of the interval between adjacent longitudinal modes of one of the TE mode and the TM mode. At least one region may include a phase control region for only controlling the phase of a light wave propagated along the waveguide, which lacks an active layer. The active layer may comprise a bulk layer. The active layer may have a strained quantum well structure into which a coaxial tensile strain is introduced.

According to still another aspect of the present invention, there is provided an optical communication method for transmitting a signal from a transmitter to a receiver through an optical transmission line. The method includes a step of modulating the polarization mode of output light from a semiconductor laser between the TE mode and the TM mode by controlling current injected into the above semiconductor laser, a step of selecting only the output light in one of the TE mode and the TM mode to create an amplitude-modulated signal, and a step of transmitting the amplitude-modulated signal through an optical transmission line.

The wavelength of the amplitude-modulated signal may be tunable by the semiconductor laser, and a signal at a desired wavelength is selectively detected by using a wavelength filter at a receiver side. A plurality of wavelength filters may be used to selectively detect signals at respective desired wavelengths to perform a wavelength division multiplexing optical communication.

According to still another aspect of the present invention, there is provided an optical communication system for transmitting a signal from a transmitter to a receiver through an optical transmission line. The system includes the above semiconductor laser provided in a transmitter, polarization mode of output light from which is modulated between the TE mode and the TM mode by controlling current injected into the semiconductor laser, and a unit for selecting only the output light in one of the TE mode and the TM mode to create an amplitude-modulated signal, which is transmitted from the transmitter to a receiver through an optical transmission line.

The semiconductor laser may be designed to change the wavelength of the amplitude-modulated signal, and a wavelength filter is provided in the receiver for selectively detecting a signal at a desired wavelength. A plurality of wavelength filters may be used to selectively detect signals at respective desired wavelengths to perform a wavelength division multiplexing optical communication.

According to still another aspect of the present invention, there is provided a transmitter which includes the above semiconductor laser, polarization mode of output light from which is modulated between the TE mode and the TM mode by controlling current injected into the semiconductor laser, and a unit for selecting only the output light in one of the TE mode and the TM mode to create an amplitude-modulated signal.

These advantages and others will be more readily understood in connection with the following detailed description of the preferred embodiments in conjunction with the drawings.

BRIEF DESCRIPTION OF THE DRAWINGS

FIGS. 6A, 6B and 6C are views illustrating an optical communication system in which the first embodiment and its modulation method are used.

FIG. 17B is an enlarged cross-sectional view of an active layer of the seventh embodiment.

DESCRIPTION OF THE PREFERRED EMBODIMENTS

First Embodiment

Figure 1A:
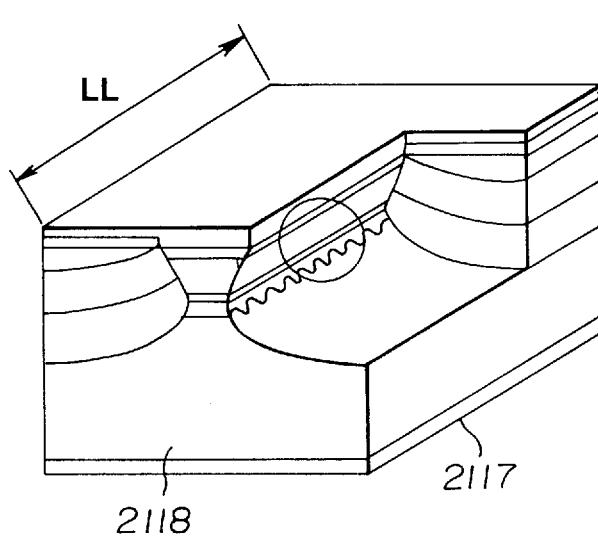
FIG. 1A is a partly-broken perspective view illustrating a prior art DFB semiconductor laser.
Figure 1B:
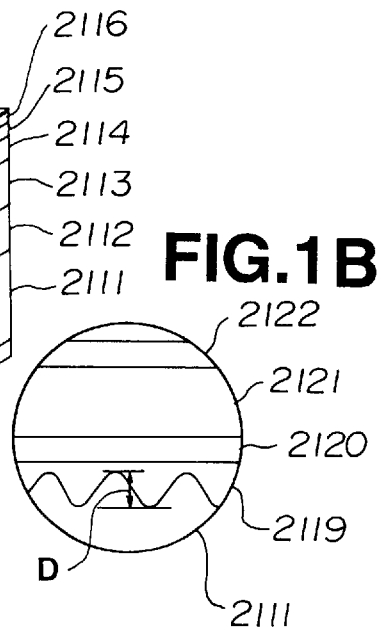
FIG. 1B is a close-up view of a portion of FIG. 1A.
Figure 2A:
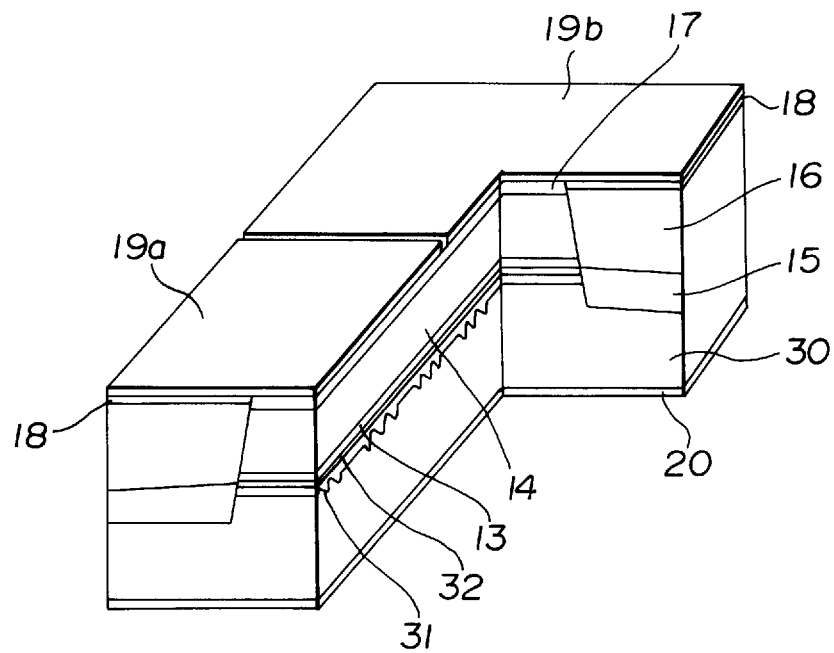
FIG. 2A is a perspective view of a first embodiment of a semiconductor laser, whose right-side portion is partly cut away, according to the present invention.
Figure 2B:
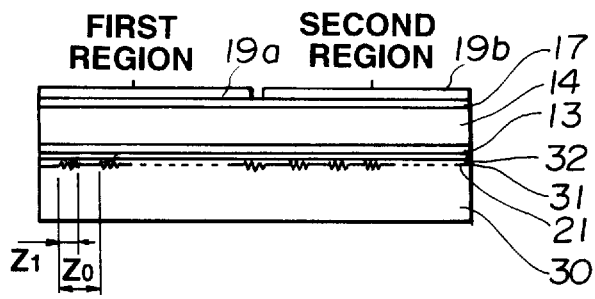
FIG. 2B is a cross-sectional view of the first embodiment along a resonance direction.
Figure 3:
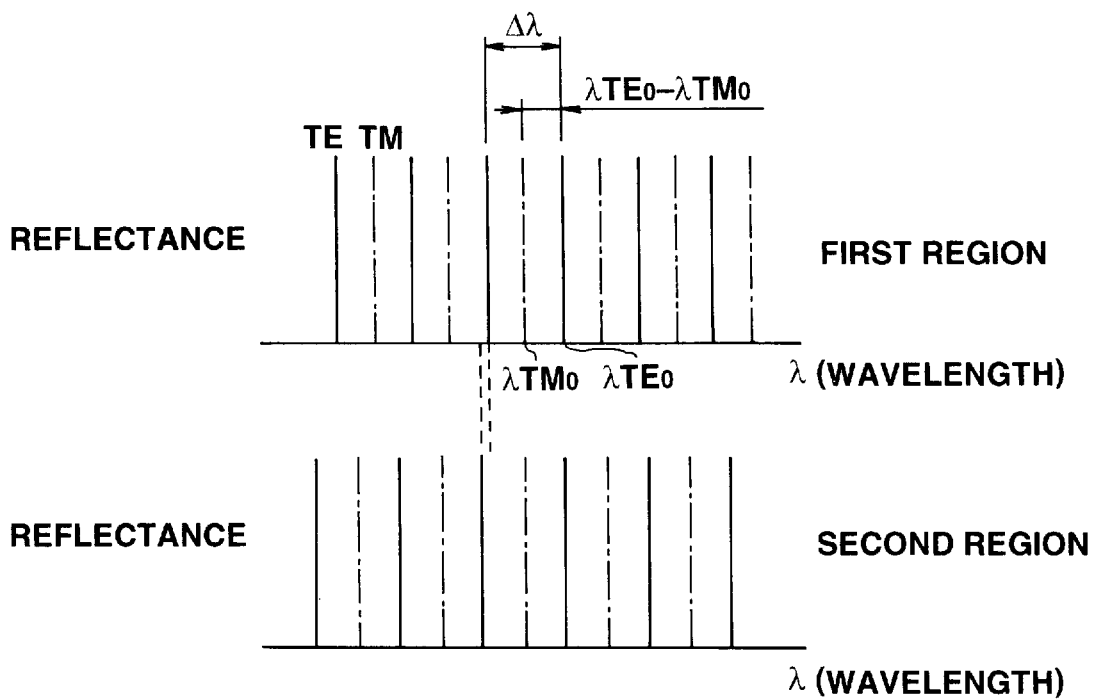
FIG. 3 is a graph illustrating reflection characteristics for the TE mode and the TM mode of the first embodiment.

A first embodiment of the present invention will be described with reference to FIG. 2. FIG. 3 illustrates characteristics of a laser of the first embodiment.

In recent years, there has been developed a semiconductor laser provided with a reflector which has a plurality of high reflection peaks at multiple wavelengths and for which intervals between the high reflection peaks can be flexibly designed by the structure of its diffraction grating. Thereby, the wavelength changeable width of a wavelength tunable laser can be expanded. That is, for example, a DFB or DBR (distributed Bragg reflector) laser having a reflector which is comprised of a sampled grating (see V. Jayaraman, Appl. Phys. Lett., 60(19), 1992 (p.2321)) or a diffraction grating of a super-periodical structure (see Kano et al, Electronics Information Communication Technology, OQE 92–131, 1992 (p.39)).

Figure 4A:
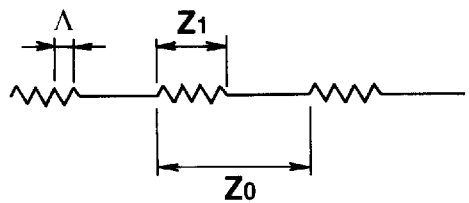
FIG. 4A is a view illustrating the structure of a sampled grating.
Figure 4B:
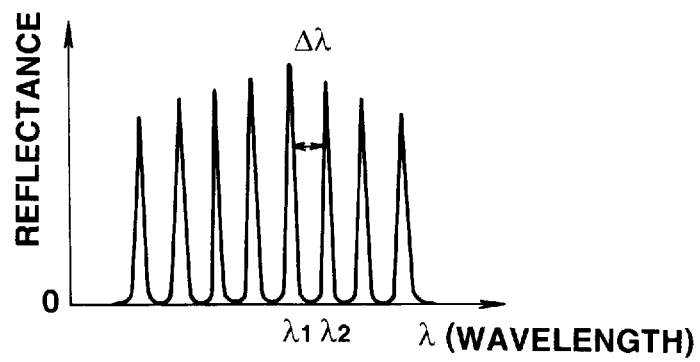
FIG. 4B is a graph illustrating reflection characteristics of the sampled grating.

A semiconductor laser of the first embodiment is a two-electrode DFB laser a reflector of which is comprised of a sampled grating. The structure of the sampled grating is shown in FIG. 4A. In the sampled grating, there are repetitive sets of a portion with a diffraction grating and a portion without a diffraction grating which are arranged at intervals of sampling pitch $Z_0$. Characteristics of the reflector are illustrated in FIG. 4B. The wavelength interval $\Delta\lambda$ at wavelength $\lambda$ between the high reflection peaks of the reflector comprised of the sampled grating is given as:

$$\Delta\lambda = \lambda^2/(2\mu_g Z_0) \quad (1)$$

where $Z_0$ is the sampling pitch and $\mu_g$ is the mode group index. By determining the sampling pitch $Z_0$ in relation (1), it is possible to build a reflector with a desired wavelength interval between the high reflection peaks.

Figure 4C:
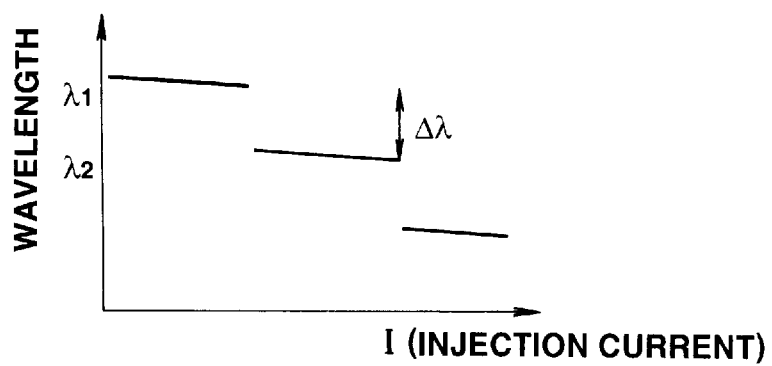
FIG. 4C is a graph illustrating the relationship between injection current and oscillation wavelength of a tunable layer having a sampled grating.

In this embodiment, intervals between the high reflection peak wavelengths of respective reflectors comprised of respective sampled gratings in two electrically-separated regions of the laser are made slightly different from each other. Appropriate currents are injected into the two regions to change refractive indices of waveguide in the two regions. Thus, a single longitudinal oscillation mode is selected. Since the intervals between the high reflection peak wavelengths in the two regions are slightly different from each other, different oscillation polarization modes can be selected one after another due to bernier effect by a slight change in the injection current (see FIG. 3). In such a manner, a relatively wide change in oscillation wavelength can be obtained. FIG. 4C illustrates current-wavelength characteristics of a wavelength tunable laser provided with a sampled grating. After one longitudinal oscillation mode is selected, the oscillation wavelength can be finely adjusted by controlling the injection current.

In general, since oscillation in the TE mode is desired, gain of the active layer, coatings at end facets, coupling coefficient of the grating (due to its depth and the like), Bragg wavelength and so forth are designed to be optimum for the TE mode. Thus, the laser generally oscillates in the TE mode.

Turning back to FIGS. 2A and 2B, a fabrication method of a device of the first embodiment will be described. A diffraction grating 21 of sampled grating is formed on an n-type InP substrate 30. On the grating 21, an n-type InGaAsP guide layer 31, an undoped($\phi$)-InGaAsP active layer 32, a p-type InGaAsP buffer layer 13, a p-type InP clad layer 14 and a p-type InGaAsP contact layer 17 are consecutively layered in this order. Then, etching is conducted down to the substrate 30 with a mesa stripe of a width 2 $\mu$m being left, and its surroundings are buried with a p-type InP layer 15 and an n-type InP layer 16. On the thus-formed wafer, an insulating layer 18 of $SiO_2$ and p-type electrodes 19a and 19b are formed, and a common n-type electrode 20 is deposited on the bottom surface of the wafer.

Respective first and second regions are electrically separated from each other such that current injected into those regions can be independently controlled. The cavity length in a longitudinal direction is set to 600 μm. Antireflection (AR) coatings (not shown) are deposited on the end facets of the device of this embodiment to establish a reflectance less than 0.1% thereat. The grating pitch Λ of the grating 21 of sampled grating formed on the InP substrate 30 is set to 0.235 μm (see FIG. 4A). In the first region, the length $Z_1$ of the grating portion is 5 μm and the sampling pitch $Z_0$ is 50 μm. In the second region, the length $Z_1$ of the grating portion is 5 μm and the sampling pitch $Z_0$ is 45 μm.

The device operates in the following manner. FIG. 3 shows reflection characteristics of the reflector or the grating 21 of this embodiment. In the DFB-LD of this embodiment, effective refractive indices for the TE polarization mode and the TM polarization mode differ from each other, so the high reflection peak wavelengths for those polarization modes are also different from each other. In this embodiment, the effective indices are designed such that a wavelength difference between center wavelengths $\lambda_{TEO}$ and $\lambda_{TMO}$ of reflection spectra for the TE mode and the TM mode is equal to about a half (½) of the wavelength difference Δλ between adjacent high reflection peak wavelengths for either polarization mode.

That is, from relation (1) and $\lambda_{TEO} - \lambda_{TMO} = \Delta\lambda/2$, $$n_{TE} - n_{TM} = \lambda T^{TEO2}/(8 \mu_g Z_0 \Lambda) \sim 7.7 \times 10^{-3}$$

where $n_{TE}$ and $n_{TM}$ are effective refractive indices for the TE mode and the TM mode, and $\mu_g$ is the mode group refractive index for the TE mode at the center wavelength of reflection spectrum for the TE mode. In this embodiment, the layer structure is designed such that a difference between effective indices for the TE mode and the TM mode becomes about $7.7 \times 10^{-3}$. Thereby, each high reflection peak for the TM mode is placed near a center between the adjacent high reflection peaks for the TE mode, as illustrated in FIG. 3.

Figure 5:
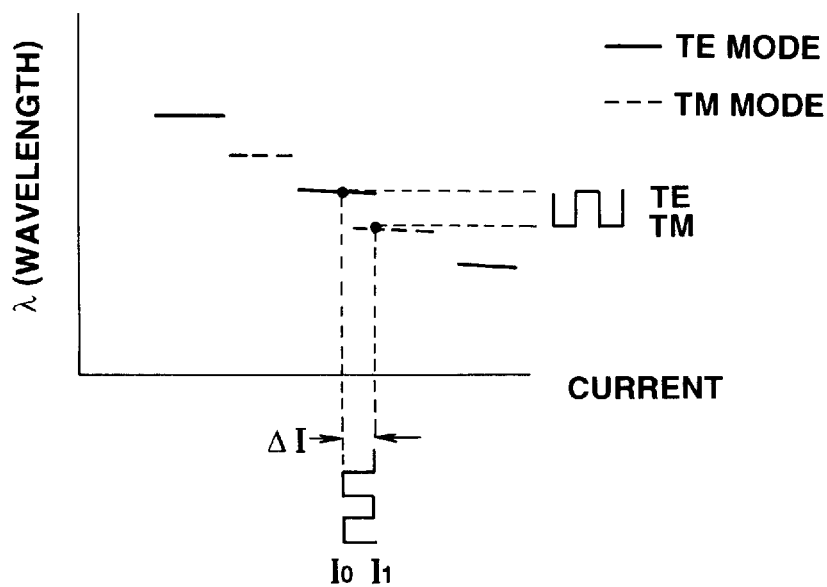
FIG. 5 is a graph illustrating current versus oscillation wavelength characteristics and a modulation method of the first embodiment.

In this embodiment, the wavelength intervals between the high reflection peaks in the first and the second regions are made a little different from each other as described above, so different longitudinal modes can be selected in succession by slightly changing the current injected into the device. Moreover, the longitudinal mode for the TM mode is disposed between the adjacent longitudinal modes for the TE mode, so that the oscillations in the TE mode and the TM mode occur alternately. Thus, the relationship between current and oscillation wavelength and mode as illustrated in FIG. 5 can be attained by controlling the current injected into each electrode 19a and 19b. In this embodiment, each high reflection peak for the TM mode is placed near a center between the adjacent high reflection peaks for the TE mode as discussed above, so that instability and noise due to competition between two adjacent longitudinal modes for the TE mode can be greatly reduced.

FIG. 5 also illustrates a modulation method for driving the laser of this embodiment. A bias current $I_0$ is injected into one of the first and second regions of the semiconductor and a modulation current $\Delta I = I_1 - I_0$ is superposed on the bias current. Thereby, output light from the device is modulated or switched between the TE polarization mode and the TM polarization mode. The output light is input into a polarizer and only light in one of the TE mode and the TM mode is transmitted therethrough. Accordingly, light power can be picked out as a zero-one signal.

FIG. 6A shows the structure of an optical communication system which uses a semiconductor laser of this embodiment and its modulation method.

According to the method of FIG. 5, the modulation current is injected into a semiconductor laser 1 which has the characteristics as illustrated in FIG. 5, and output light 7 (see FIG. 6B) is switched between the TE mode and the TM mode. The output light 7 is input into a polarizer 2 through a lens 3, and only light in the TE mode or the TM mode is transmitted therethrough. Thus, a signal 6 having power 1 or 0 (see FIG. 6C) can be produced. The light 6 transmitted through the polarizer 2 is coupled to an optical fiber 4 using a lens 3. The light 6 is transmitted through the optical fiber 4 and the signal of the light 6 is detected by a photodetector 5.

In this embodiment, the signal modulation with a large extinction ratio can be obtained by a minute modulation current. Therefore, fluctuation in carrier density in the laser is small, so the chirping is reduced and the line width of oscillation spectrum is lessened. Hence, high-speed modulation can be achieved with favorable characteristics. Furthermore, compared to an ordinary DFB laser, since the reflection characteristic is unlikely to be influenced by the phase at the end facet and the like, switching between the TE mode and the TM mode can be stably effected.

Second Embodiment

Figure 7:
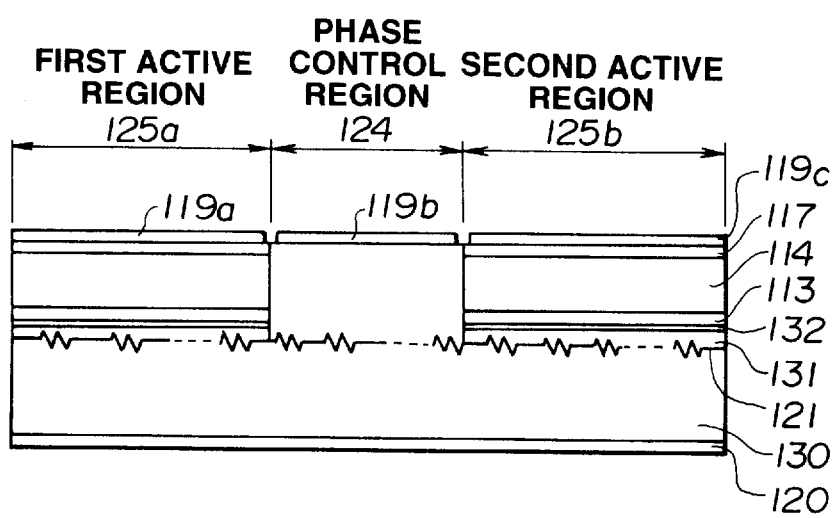
FIG. 7 is a cross-sectional view of a second embodiment of a semiconductor laser according to the present invention.

A second embodiment of the present invention will be described with reference to FIG. 7. A device of this embodiment has three regions. A central region is a phase control region 124, and regions at both opposite ends are first and second active regions 125a and 125b. The phase control region 124 lacks an active layer. Accordingly, phase and gain can be controlled independently.

A fabrication method of a device of this embodiment will be described. A diffraction grating 121 of sampled grating is formed on an n-type InP substrate 130. On the grating 121, an n-type InGaAsP guide layer 131, a φ-InGaAsP active layer 132, a p-type InGaAsP buffer layer 113, a p-type InP clad layer 114 and a p-type InGaAsP contact layer 117 are consecutively layered in this order. Then, etching is conducted down to the active layer 132 solely in the phase control region 124, and another p-type InP layer 114 is layered thereon. Thereafter, etching is conducted down to the substrate 130 with a mesa stripe of a width 2 μm being left, and its surroundings are buried with a p-type InP layer and an n-type InP layer (in this connection, see FIG. 2A). The respective first and second active regions 125a and 125b and the phase control region 124 are electrically separated from each other such that current injected into those regions can be independently controlled. Further, p-type electrodes 119a, 119b and 119c are formed, and an n-type common electrode 120 is formed on the bottom surface of the device. Each of the first and second active regions 125a and 125b has a length of 300 μm, and the phase control region 124 has a length of 200 μm. Antireflection (AR) coatings (not shown) are deposited on the end facets of the device to establish a reflectance less than 0.1% thereat. The grating pitch Λ of the grating 121 of sampled grating (see FIG. 4A) formed on the InP substrate 130 is set to 0.235 μm, similar to the first embodiment. Further, in the first and second regions 125a and 125b, the length $Z_1$ of the grating portion is 5 μm and the sampling pitch $Z_0$ is 50 μm. In the phase control region 124, the length $Z_1$ of the grating portion is 5 μm and the sampling pitch $Z_0$ is 45 μm.

The device operates in the following manner. In the DFB-LD of this embodiment, effective refractive indices for the TE mode and the TM mode differ from each other. Accordingly, the high reflection peak wavelengths for those polarization modes are also different from each other. Similar to the first embodiment, the layer structure or effective index is designed such that each high reflection peak for the TM mode is placed near a center between the adjacent high reflection peaks for the TE mode. Also in this embodiment, the wavelength intervals between the high reflection peaks in the first and second active regions 125a and 125b are made a little different from that in the phase control region 124 as described above, so that different longitudinal modes can be selected in succession by slightly changing the injection current. Moreover, the longitudinal mode for the TM mode falls between the adjacent longitudinal modes for the TE mode, so that the oscillation in the TE mode and the TM mode occurs alternately. Thus, the relationship between current and oscillation wavelength and mode as illustrated in FIG. 5 can be obtained by controlling currents injected into the electrodes 119a, 119b and 119c. Further, in this embodiment, the phase control region 124 is formed in a central portion of the device, so that the effective refractive index can be appropriately changed by the injection current thereinto. Thus, phase and gain can be independently controlled. Therefore, unfavorable influences due to phase at the end facets of the grating 121 and reflectance at the end facets can be further reduced, and hence more effective and stable oscillation can be achieved than the first embodiment.

A modulation method for driving the laser of this embodiment is as follows. Similar to the first embodiment, bias currents $I_0$ are injected into the first and second active regions 125a and 125b of the semiconductor laser and a modulation current $\Delta I = I_1 - I_0$ is superimposed on the bias current. Thereby, output light from the device is modulated or switched between the TE mode and the TM mode. The output light is processed in the same manner as discussed above referring to FIGS. 6A–6C. An optical communication system similar to the first embodiment can be constructed by using that modulation method.

Also in this embodiment, the signal modulation with a large extinction ratio can be obtained by a minute modulation current. Therefore, fluctuation in carrier density in the laser is small, so the chirping is reduced and the line width of oscillation spectrum is lessened. Hence, high-speed modulation can be achieved with favorable characteristics. Furthermore, compared to the first embodiment, since gain and phase can be independently controlled by injecting current into the phase control region 124, the switching between the TE mode and the TM mode can be more stably effected.

Third Embodiment

Figure 8A:
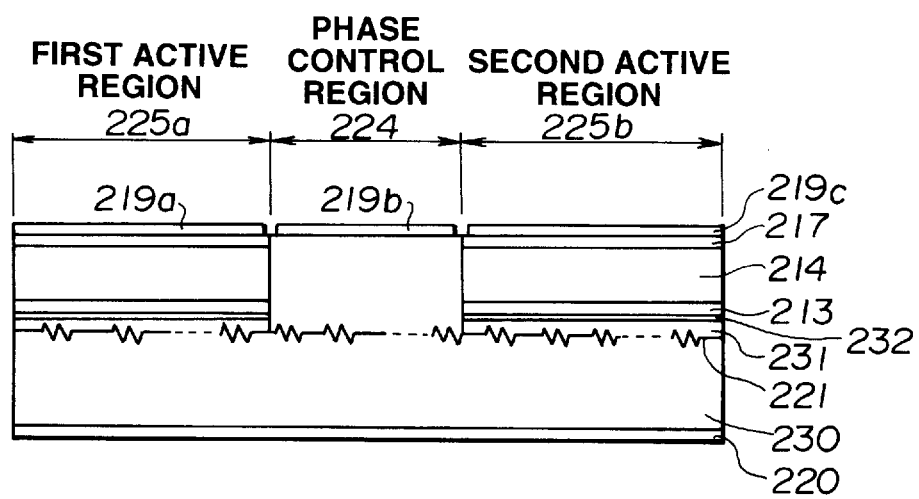
FIG. 8A is a cross-sectional view of a third embodiment of a semiconductor laser according to the present invention.
Figure 8B:
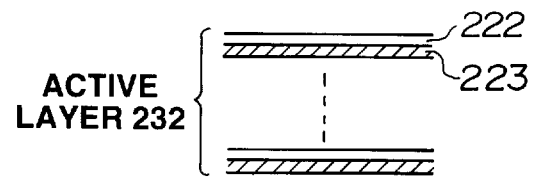
FIG. 8B is an enlarged cross-sectional view of an active layer of the third embodiment.

A third embodiment of the present invention will be described with reference to FIGS. 8A and 8B. A device of this embodiment has three regions, similar to the second embodiment. A central region is a phase control region 224, and regions at both opposite ends are first and second active regions 225a and 225b. The phase control region 224 lacks an active layer. Accordingly, phase and gain can be independently controlled. In this embodiment, a strained quantum well structure is introduced into an active layer 232, so that high performance of the device can be achieved.

A fabrication method of a device will be described with reference to FIGS. 8A and 8B. A diffraction grating 221 of sampled grating is formed on an n-type InP substrate 230. On the grating 221, an n-type InGaAsP guide layer 231, the strained quantum well active layer 232, a p-type InGaAsP buffer layer 213, a p-type InP clad layer 214 and a p-type InGaAsP contact layer 217 are consecutively grown in this order. The active layer 232 consists of ten pairs of well layers 222 and barrier layers 223, as shown in FIG. 8B. The well layer 222 is an intrinsic $In_{0.53}Ga_{0.47}As$ having a thickness of 5 nm, and the barrier layer 223 is an intrinsic $In_{0.28}Ga_{0.72}As$ having a thickness of 5 nm.

Then, etching is conducted down to the active layer 232 only in the phase control region 224, and a p-type InP layer 214 is layered thereon. Thereafter another etching is conducted down to the substrate 230 with a mesa stripe of a width 2 $\mu$m being left, and its surroundings are buried with a p-type InP layer and an n-type InP layer. The respective first and second active regions 225a and 225b and the phase control region 224 are electrically separated from each other such that current injected into those regions can be independently controlled. Further, p-type electrodes 219a, 219b and 219c are formed, and an n-type common electrode 220 is formed on the bottom surface of the device. Each of the first and second active regions 225a and 225b has a length of 300 $\mu$m, and the phase control region 224 has a length of 200 $\mu$m. Antireflection (AR) coatings (not shown) are deposited on the end facets of the device to establish a reflectance less than 0.1% thereat. The grating pitch $\Lambda$ of the sampled gratings 221 formed on the InP substrate 230 is set to 0.235 $\mu$m, similar to the first embodiment. Further, in the first and second regions 225a and 225b, the length $Z_1$ of the grating portion is 5 $\mu$m and the sampling pitch $Z_0$ is 50 $\mu$m. In the phase control region 224, the length $Z_1$ of the grating portion is 5 $\mu$m and the sampling pitch $Z_0$ is 45 $\mu$m.

The device operates in the following manner. In this embodiment, the active layer 232 is comprised of a multiple quantum well structure, and tensile strain is introduced into the barrier layer 223. Therefore, the gain for the TM polarization mode is made close to the gain for the TE polarization mode, and yield as a TE/TM switching laser is greatly improved. Further, compared with a case of a bulk active layer, a large gain coefficient can be obtained by a low current density.

Similar to the first embodiment, the layer structure or the effective refractive index is designed such that each high reflection peak for the TM mode is placed near a center between the adjacent high reflection peaks for the TE mode. Also in this embodiment, the wavelength interval between the high reflection peaks in the first and second active regions 225a and 225b are made a little different from that in the phase control region 224, similar to the first embodiment. Accordingly, different longitudinal modes can be selected in succession by slightly changing the injection current. Moreover, the longitudinal mode of the TM mode lies between the adjacent longitudinal modes of the TE mode, so that the oscillations in the TE mode and the TM mode occur alternately. Thus, the relationship between current and oscillation wavelength and mode as illustrated in FIG. 5 can be obtained by controlling current injected through the electrodes 219a, 219b and 219c. Further, in this embodiment, the phase control region 224 is formed in a central portion of the device, similar to the second embodiment, so that phase and gain can be independently controlled. As a result, stable oscillation can be achieved.

A modulation method for driving the laser of this embodiment is as follows. Similar to the second embodiment, bias currents $I_0$ are injected into the first and second active regions 225a and 225b of the semiconductor laser and a modulation current $\Delta I = I_1 - I_0$ is superposed on the bias current. Thereby, output light from the device of this embodiment is modulated or switched between the TE polarization mode and the TM polarization mode. The output light is processed in the same manner as discussed in the first embodiment. An optical communication system similar to the first embodiment can be constructed by using that modulation method.

Also in this embodiment, the signal modulation with a large extinction ratio can be obtained by a minute modulation current. Therefore, fluctuation in carrier density in the laser is small, so that the chirping is reduced and the line width of oscillation spectrum is lessened. Hence, high-speed modulation can be achieved with favorable characteristics. Furthermore, compared to the first embodiment, since phase can be adjusted by injecting current into the phase control region 224, the switching between the TE mode and the TM mode can be more stably effected. Moreover, yield as a TE/TM switching laser is highly improved by making gains for the TE mode and the TM mode substantially equal to each other.

Fourth Embodiment

A fourth embodiment of the present invention will be described with reference to FIG. 9. A wavelength tunable laser used in this embodiment is a laser which has the same characteristics as the laser used in the first embodiment. The oscillation wavelength of the laser used in the first embodiment can be changed by varying current injected into the first and second regions.

Figure 9:
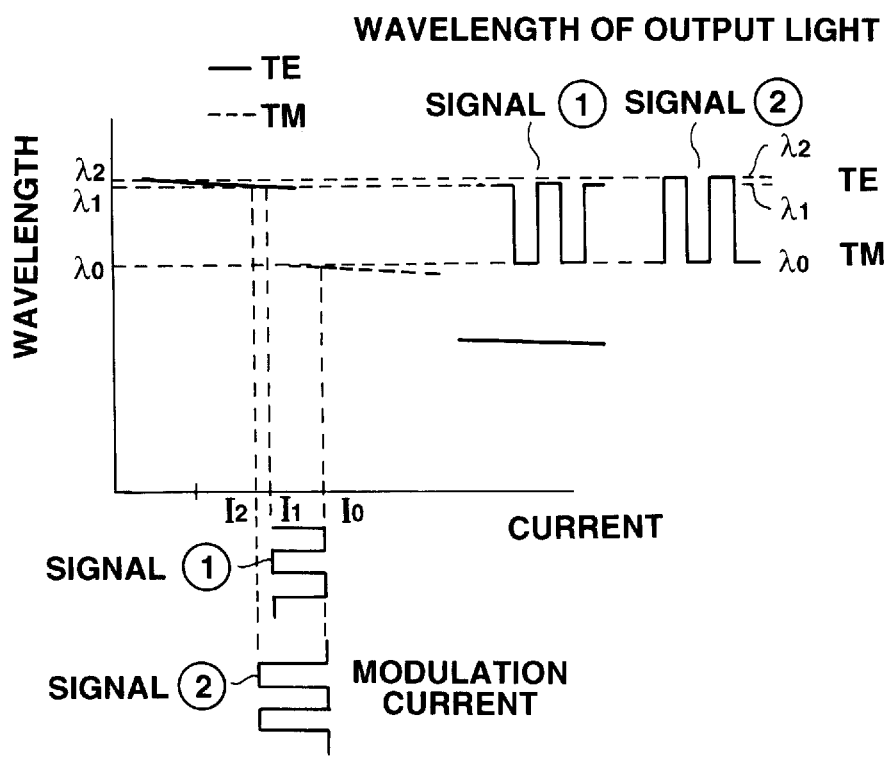
FIG. 9 is a graph illustrating current-wavelength characteristics and a modulation method of a fourth embodiment of the present invention.

A modulation method for switching the laser of the first embodiment used in the fourth embodiment is illustrated in FIG. 9. Similar to the first embodiment, a bias current $I_0$ is injected into one of the first and second regions of the semiconductor laser, and a modulation current $\Delta I = I_1 - I_0$ is superposed, as a signal $\hat{1}$, on the bias current. Thereby, output light is modulated or switched between a wavelength $\lambda_1$ (the TE mode) and a wavelength $\lambda_0$ (the TM mode). Similarly, a bias current lo is injected into one of the two regions of the semiconductor laser, and a modulation current $\Delta I = I_2 - I_0$ is superposed, as a signal $\hat{2}$, on the bias current. Thereby, output light is modulated or switched between a wavelength $\lambda_2$ (the TE mode) and $\lambda_0$ (the TM mode). Consequently, the polarization mode and the wavelength of the output light can be changed by varying the modulation current. The output light is input into a polarizer 2, shown in FIG. 10A, and only light in the TE mode (the TM-mode light at wavelength $\lambda_0$ is cut) is transmitted therethrough. Thus, for light at the wavelengths $\lambda_1$ and $\lambda_2$, light power can be picked out as a zero-one signal.

Figure 10A:
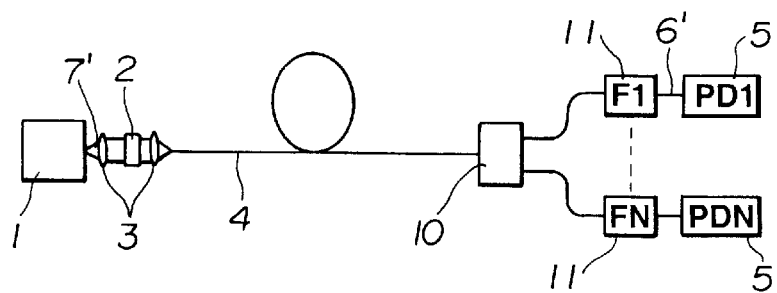
FIGS. 10A, 10B, 10C and 10D are views illustrating a wavelength division multiplexing optical communication system in which a device of the fourth embodiment and its modulation method are used.

FIG. 10A shows the structure of a wavelength division multiplexing optical communication system using the modulation method of the fourth embodiment.

Figure 10B:
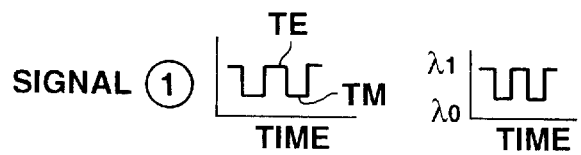
Figure 10B:
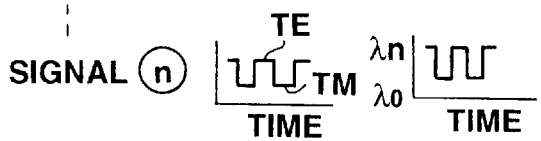
Figure 10C:
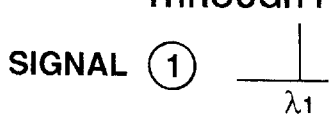
Figure 10C:
Figure 10C:
Figure 10D:
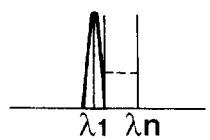

At least one semiconductor laser 1 is modulated by a modulation current $I_n - I_0$ (n=1, 2, . . . ) according to the above method (see FIG. 9). The output light becomes a signal 7' (signal ñ, n=1, 2, . . . ) which is modulated between a wavelength $\lambda_0$ (the TM polarization mode) and $\lambda_n$ (the TE polarization mode), as shown in FIG. 10B. The light 7' is input into a polarizer 2 through a lens 3, and only $\lambda_n$ (the TE polarization mode) is transmitted therethrough. The light transmitted through the polarizer 2 is coupled to an optical fiber 4 using a lens 8. After transmission through the optical fiber 4, the light is divided into n portions by a branching device 10. Only a component at wavelength $\lambda_n$ of the divided portion is transmitted through a receiving filter 11 (Fn) having characteristic as illustrated in FIG. 10D, and a signal 6' having a power 1 or 0 as illustrated in FIG. 10C is created.

The receiving filter 11 separates wavelengths which are only about 1 Å away from each other, so a wavelength filter having a small transmission band width is needed. For example, a DFB filter, a Fabry-Perot filter, a Max-Zehnder filter or the like can be used. Light transmitted through the receiving filter 11 is received by a photodetector 5 to detect each signal.

Further, the wavelength filter may be replaced by a tunable filter which has a tunable function, so that the channel can be freely selected on the receiver side.

Also in this embodiment, signal modulation with a large extinction ratio can be obtained by a minute modulation current. Therefore, fluctuation in carrier density in the laser is small, so the chirping is reduced and the line width of the oscillation spectrum is lessened. Hence, high-speed modulation can be performed with favorable characteristics. Further, the spectral width is small, so the number of multiplexed wavelengths can be large when different wavelengths are assigned to different signals or channels. Moreover, signals with a good extinction ratio can be obtained.

In a TE/TM modulation using an ordinary DFB laser, the operation is complicated due to phase at end facets, reflectance at end facets, gain and so forth, and hence the number of wavelength multiplicity is limited. In this embodiment, however, the wavelength tunable range can be about 10 nm and oscillation is stabilized, so that the number of wavelength multiplicity can be large. As a result, it is possible to easily establish communications that have a high extinction ratio, high speed and a large wavelength multiplicity. Further, compared to a case where modulation is performed only in the TE mode, since the longitudinal mode of the TM mode is disposed in a zone between adjacent longitudinal modes at which oscillation is most difficult to occur, the modulation can be stably conducted with low noise.

Fifth Embodiment

Figure 11:
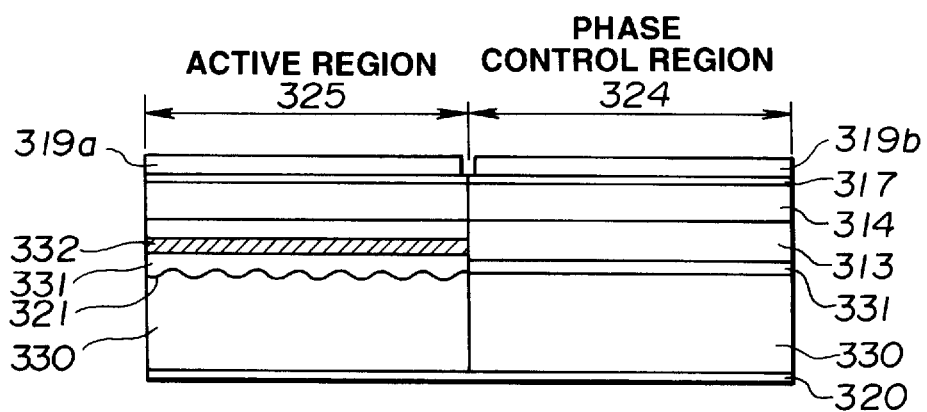
FIG. 11 is a cross-sectional view of a fifth embodiment of a semiconductor laser according to the present invention.

FIG. 11 illustrates a device of a fifth embodiment of the present invention.

First, a fabrication method of a device of the fifth embodiment will be described. A diffraction grating 321 of a pitch 245 nm is formed on an n-type InP substrate 330 partly in an active region 325. On the wafer on which the grating 321 is partly formed, an n-type InGaAsP guide layer 331, an undoped($\phi$)-InGaAsP active layer 332, a p-type InGaAsP buffer layer 313, a p-type InP clad layer 314 and a p-type InGaAsP contact layer 317 are consecutively layered in this order. Then, etching is conducted down to the active layer 332 solely in a phase control region 324, and a p-type InGaAsP layer 313, a p-type InP layer 314 and a p-type InGaAsP contact layer 317 are deposited thereon. Thereafter, another etching is conducted down to the substrate 330 with a mesa stripe of a width 2 $\mu$m being left, and its surroundings are buried with a p-type InP layer and an n-type InP layer (not shown). The active region 325 and the phase control region 324 are electrically separated from each other such that those regions can be independently controlled electrically. On the thus-formed wafer, p-type electrodes 319$a$ and 319$b$ are formed, and a common n-type electrode 320 is deposited on the bottom surface of the wafer. Each of the active region 325 and the phase control region 324 is 300 $\mu$m in length. Antireflection (AR) coatings (not shown) are deposited on the end facets of the device to establish a reflectance less than 0.1% thereat.

Figure 12:
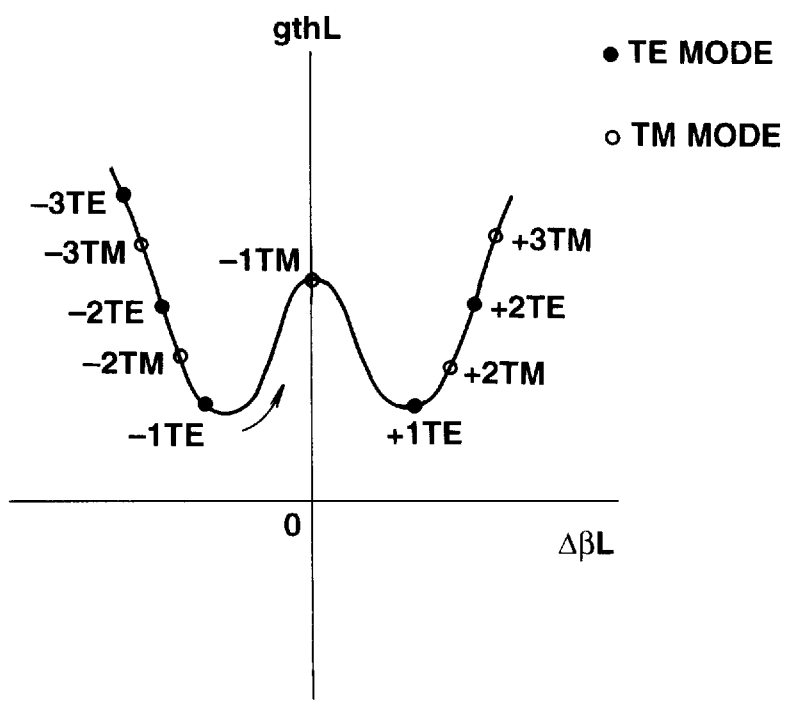
FIG. 12 is a graph illustrating the relationship between $\Delta\beta L$ and $g_{th}L$ of the fifth embodiment.

The device operates in the following manner. FIG. 12 shows the relationship between $\Delta\beta L$ ($\beta$ is the propagation constant) and $g_{th}L$ (L is the length of the phase control region and $g_{th}$ is the threshold gain) of a DFB-LD of this embodiment, wherein $\Delta\beta = \beta_{TE} - \beta_{BTE}$ in the case of the TE mode, $\Delta\beta = \beta_{TM} - \beta_{BTM}$ in the case of the TM mode and suffixes TE, TM and B respectively indicate TE mode, TM mode and Bragg wavelength. Respective TE modes and TM modes are plotted on a common graph. Therefore, wavelengths of origins are different between the TE mode and the TM mode, but the common graph is used for the sake of easy understanding. As the variation or displacement amount of phase in the phase control region 324 changes, $\Delta\beta$ and gain coefficient $g_{th}L$ for the oscillation longitudinal mode vary. The point of longitudinal mode (±1, ±2, ±3 . . . ) moves along the curve of FIG. 12 as the displacement amount of phase varies. The variation amount φ of phase created near the Bragg wavelength in the phase control region 324 is represented by:

$$\phi = 2\beta L \quad (2)$$
$$= 2\pi(n_2/n_1)L/\Lambda$$

where β is the propagation constant at the Bragg wavelength ($2n_1\Lambda$), L is the length of the phase control region, $n_1$ is the effective refractive index of the active region, $n_2$ is the effective refractive index of the phase control region and Λ is the pitch of the diffraction grating. In this embodiment, the difference ($\Phi_{TE}-\Phi_{TM}$) between the variation amounts of phase near the respective Bragg wavelengths for the TE mode and the TM mode is set to π, so that the oscillation mode in the TM polarization mode is placed approximately at a center between the adjacent oscillation modes in the TE polarization mode as illustrated in FIG. 12.

Detailed means will be described for setting the difference ($\Phi_{TE}-\Phi_{TM}$) between the variation amounts of phase near the respective Bragg wavelengths for the TE mode and the TM mode in the phase control region 324 to π.

Namely, $(\Phi_{TE}-\Phi_{TM})=\pi$ (3)

From relations (2) and (3), $$n_{2TE}/n_{1TE}-n_{2TM}/n_{1Tm}=\Lambda/2L \quad (4).$$

In this embodiment, the effective index for the TM polarization mode in the active region 325 is set equal to the effective index for the TM polarization mode in the phase control region 324 (i.e., $n_{2TM}/n_{1TM}=1$).

Therefore, relation (3) can be satisfied by establishing relation $n_{2TE}-n_{1TE}\approx 1.39\times 10^{-3}$ for the TE polarization mode. In this case, the oscillation longitudinal mode in the TM mode is located approximately at a center between the oscillation longitudinal modes in the TE mode as illustrated in FIG. 12.

In the first place, only the TE mode will be considered. As current injected into the phase control region 324 increases, the longitudinal mode moves in a direction of arrow in FIG. 12. First, the mode of −1TE gets to a minimum threshold gain and the oscillation occurs in this mode. As the injection current further increases, the threshold gain for −1TE mode of the TE mode begins to increase and the threshold gain for −2TE mode of the TE mode decreases and reaches a minimum threshold gain, leading to the oscillation in this longitudinal mode. Near a place where threshold gains for two longitudinal modes approach each other, a minimum threshold gain increases.

Next, both the TE mode and the TM mode will be considered. As current injected into the phase control region 324 increases, the mode of −1TE gets to a minimum threshold gain and the oscillation occurs in this mode. As the injection current further increases, the threshold gain for −1TE mode of the TE mode begins to increase and threshold gains for −2TE mode of the TE mode and −2TM mode of the TM mode decrease. The −2TM mode of the TM mode first reaches a minimum threshold gain, and then the −2TE mode of the TE mode gets to a minimum threshold gain. In this embodiment, since the oscillation mode in the TM mode is located approximately at a center between the oscillation modes in the TE mode, the threshold gain for the TM mode becomes minimum near a place where the minimum threshold gain for the TE polarization mode increases.

Figure 13:
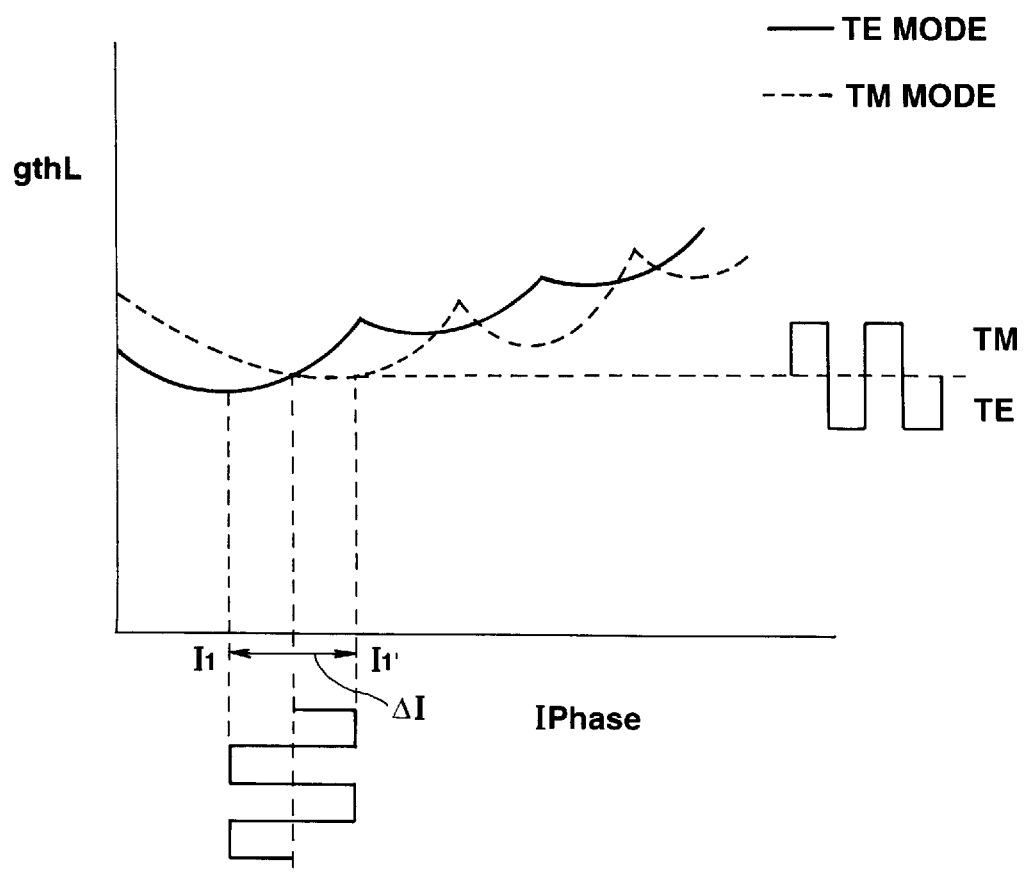
FIG. 13 is a graph illustrating the relationship between phase adjusting current and threshold gain and a modulation method of the fifth embodiment.

FIG. 13 illustrates the relationship between the current $I_{phase}$ injected into the phase control region 324 and the threshold gain $g_{th}L$. As $I_{phase}$ increases, the oscillation zone in the TE mode and the oscillation zone in the TM mode appear alternately. Since the threshold gain for one polarization mode begins to decrease near a place where another polarization mode is displaced and its minimum threshold gain begins to increase, noises become small and the oscillation is stabilized. Further, yield for the oscillation in each of the TE mode and the TM mode is improved.

FIG. 13 also illustrates a modulation method for driving the laser of this embodiment. A bias current $I_1$ is injected into the phase control region 324 of the semiconductor laser and a modulation current $\Delta I=1_1'-I_1$ is superposed on the bias current. Thereby, output light from the device is modulated or switched between the TE polarization mode and the TM polarization mode. The output light is processed in the same manner as the first embodiment. This embodiment also can be used in the structure of an optical communication system of FIGS. 10A–10D, similar to the first embodiment.

Sixth Embodiment

Figure 14:
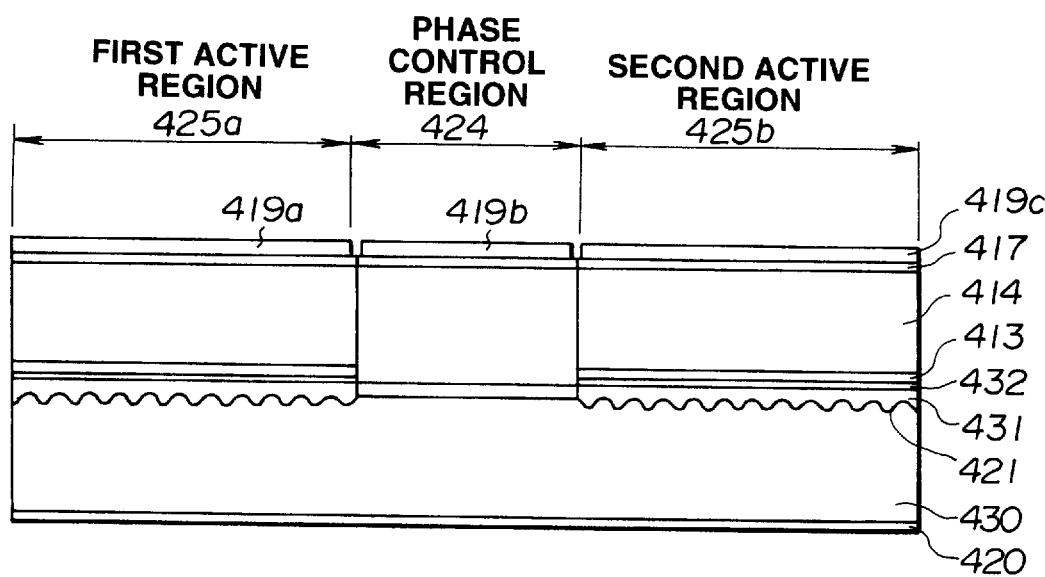
FIG. 14 is a cross-sectional view of a sixth embodiment of a semiconductor laser according to the present invention.

A sixth embodiment of the present invention will be described with reference to FIG. 14. A device of this embodiment has three regions. A central region is a phase control region 424, and regions at both opposite ends are first and second active regions 425a and 425b. The phase control region 424 lacks an active layer 432 and a grating 421.

Phenomenon caused by the presence of phase shift in the phase shift control region 424 will be described. When explanation is made at a central portion of the cavity, phases of light waves at Bragg wavelength propagated in right and left directions are not in phase with each other in the case of an even diffraction grating. Instead, phases of light waves propagated in right and left directions are matched to each other at two wavelengths on both sides of the Bragg wavelength, and oscillation is likely to occur at those two wavelengths. Reflection at those two wavelengths is weak, compared to reflection at the Bragg wavelength, so that oscillation threshold gains at those two wavelengths rise. If the phase shift is adjusted, the oscillation wavelength can be made closer to the Bragg wavelength and the threshold gain can be decreased. The difference between curves illustrated in FIGS. 12 and 15 reflects that fact.

A fabrication method of a device will be described. The diffraction grating 421 is formed on an n-type InP substrate 430 in the active regions 425a and 425b. On the wafer on which the grating 421 is partly formed, an n-type InGaAsP guide layer 431, an undoped(Φ)-InGaAsP active layer 432, a p-type InGaAsP buffer layer 413, a p-type InP clad layer 414 and a p-type InGaAsP contact layer 417 are consecutively layered in this order. Then, etching is conducted down to the active layer 432 in the phase control region 424, and a p-type InP layer 414 is deposited thereon. Thereafter, another etching is conducted down to the substrate 430 with a mesa stripe of a width 2 μm being left, and its surroundings are buried with an n-type InP layer and a p-type InP layer (not shown). The active regions 425a and 425b and the phase control region 424 are electrically separated from each other such that those regions can be independently controlled electrically.

On the thus-formed wafer, p-type electrodes 419a, 419b and 419c are formed, and a common n-type electrode 420 is deposited on the bottom surface of the wafer. Each of the active regions 425a and 425b is 300 μm in length, and the phase control layer 424 is 200 μm in length. Antireflection (AR) coatings (not shown) are deposited on the end facets of the device to establish a reflectance less than 0.1% thereat.

Figure 15:
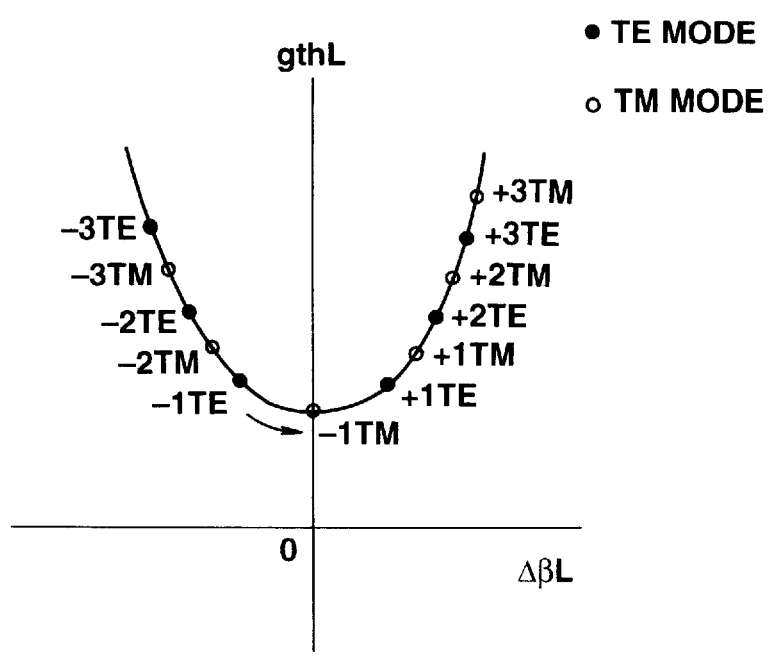
FIG. 15 a graph illustrating the relationship between $\Delta\beta L$ and $g_{th}L$ of the sixth embodiment.

The device operates in the following manner. FIG. 15 shows the relationship between ΔβL and $g_{th}L$ of a DFB-LD of this embodiment. As the variation amount of phase in the phase control region 424 changes, $\Delta\beta L$ and gain coefficient $g_{th}L$ for the oscillation mode vary. In short, the point moves along the curve of FIG. 15 as the phase displacement varies. Similar to the fifth embodiment, the difference between the phase shift or variation amounts for the TE mode and the TM mode in the phase control region 424 is set to $\pi$ by establishing the relation $n_{2TE}-n_{1TE} \approx 2.09 \times 10^{-3}$ for the TE polarization mode. Therefore, the oscillation mode of the TM mode is placed approximately at a center between the adjacent oscillation modes of the TE mode as illustrated in FIG. 15.

In the first place, only the TE mode will be considered. As current injected into the phase control region 424 increases, the mode of –1TE gets to a minimum threshold gain and the oscillation occurs in this mode. As the injection current further increases, the threshold gain for the –1TE mode of the TE mode increases and the threshold gain for –2TE mode decreases and reaches a minimum threshold gain, leading to the oscillation in the –2TE mode. At a place where threshold gains for two modes approach each other, a minimum threshold gain is raised.

Next, both the TE mode and the TM mode will be considered. As the current injected into the phase control region 424 increases, the mode of –1TM gets to a minimum threshold gain and the oscillation occurs. As the injection current further increases, the threshold gain for –1TM mode of the TM mode increases and threshold gains for –1TE mode of the TE mode and –2TM mode of the TM mode decrease. The –1TE mode of the TE mode first reaches a minimum threshold gain, and then the –2TM mode of the TM mode hits a minimum threshold gain. In this embodiment, since the oscillation mode in the TM mode is located approximately at a center between the oscillation modes in the TE mode, the threshold gain for the TM mode becomes minimum near a place where the minimum threshold gain for the TE polarization mode increases.

Figure 16:
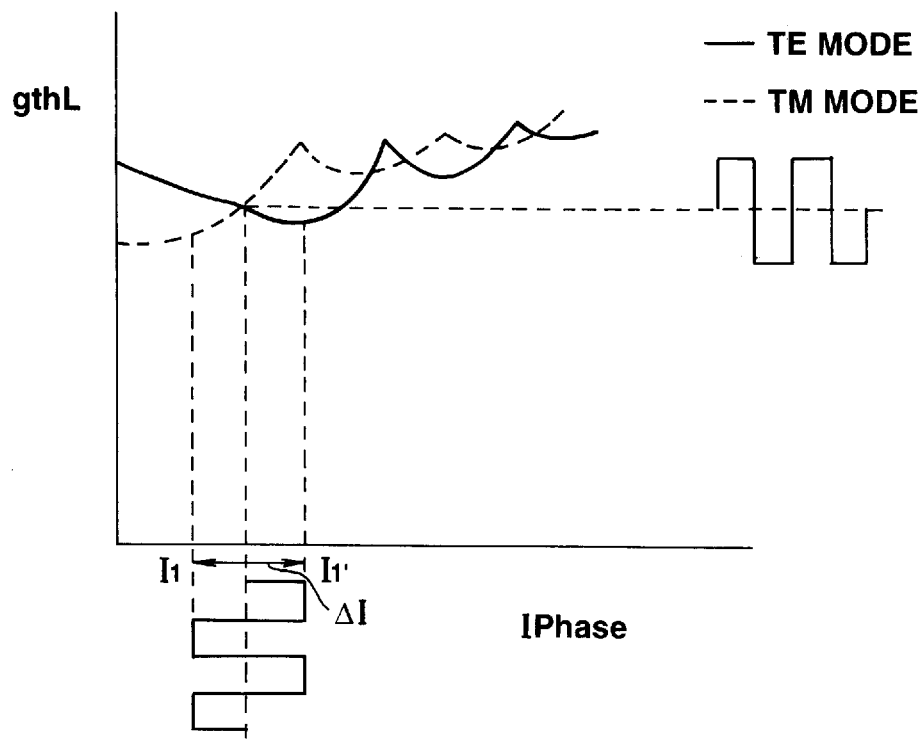
FIG. 16 is a graph illustrating the relationship between phase adjusting current and threshold gain and a modulation method of the sixth embodiment.

FIG. 16 illustrates the relationship between the current $I_{phase}$ injected into the phase control region 424 and the threshold gain $g_{th}L$. As $I_{phase}$ increases, the oscillation zone of the TE mode and the oscillation zone of the TM mode appear alternately. Since the threshold gain for one polarization mode begins to decrease near a place where another polarization mode is displaced and its minimum threshold gain begins to increase, noise is reduced and the oscillation is stabilized. Further, yield for the oscillation in each of the TE mode and the TM mode is improved.

In the fifth embodiment, as is known from FIG. 12, two points exist where $\Delta\beta L$ attains a minimum threshold gain, so that three or more than three modes should be considered for one polarization mode and the behavior is complicated. In the sixth embodiment, there is only one point where $\Delta\beta L$ attains a minimum threshold gain, and hence the behavior is simplified and the threshold gain is further lowered.

FIG. 16 also illustrates a modulation method for driving the laser of this embodiment. Similar to the fifth embodiment, a bias current $I_1$ is injected into the phase control region 424 of the semiconductor laser and a modulation current $\Delta I = I_1' - I_1$ is superposed on the bias current. Thereby, output light from the device is modulated or switched between the TE mode and the TM mode. The output light is processed in the same manner as the above embodiment. An optical communication system similar to the fourth embodiment can be constructed by using that modulation system.

In this embodiment, the phase control region 424 is provided, so that the threshold gain further decreases and the TE/TM modulation or switching can be performed more stably than the fifth embodiment.

Seventh Embodiment

A seventh embodiment of the present invention will be described with reference to FIGS. 17A and 17B. A device of this embodiment has three regions, similar to the sixth embodiment. A central region is a phase control region 524, and regions at both opposite ends are first and second active regions 525a and 525b. The phase control region 524 lacks an active layer 532. Thus, phase and gain can be independently controlled. In this embodiment, a strained quantum well structure is introduced into the active layer 532, so that high performance of the device can be achieved.

A fabrication method of a device will be described with reference to FIGS. 17A and 17B. A diffraction grating 521 is formed on an n-type InP substrate 530. On the wafer on which the grating 521 is partly formed, an n-type InGaAsP guide layer 531, a strained quantum well active layer 532, a p-type InGaAsP buffer layer 513, a p-type InP clad layer 514 and a p-type InGaAsP contact layer 517 are consecutively grown in this order. The active layer 532 consists of ten pairs of well layers 522 and barrier layers 523, as shown in FIG. 17B. The well layer 522 is an intrinsic $In_{0.53}Ga_{0.47}As$ having a thickness of 5 nm, and the barrier layer 523 is an intrinsic $In_{0.28}Ga_{0.72}As$ having a thickness of 5 nm.

Then, etching is conducted down to the active layer 532 only in the phase control region 524, and a p-type InP layer 514 is layered thereon. Thereafter, etching is conducted down to the substrate 530 with a mesa stripe of a width 2 $\mu$m being left, and its surroundings are buried with a p-type InP layer and an n-type InP layer (not shown). The respective first and second active regions 525a and 525b and the phase control region 524 are electrically separated from each other such that current injected into those regions can be independently controlled. Further, p-type electrodes 519a, 519b and 519c are formed, and an n-type common electrode 520 is formed on the bottom surface of the device. Each of the first and second active regions 525a and 525b has a length of 300 $\mu$m, and the phase control region 524 has a length of 200 $\mu$m. Antireflection (AR) coatings (not shown) are deposited on the end facets of the device to establish a reflectance less than 0.1% thereat.

The device operates in the following manner. Similar to the fifth embodiment, the difference between the phase shift amounts for the TE mode and the TM mode in the phase control region 524 is set to $\pi$ by establishing the relation $n_{2TE}-n_{1TE} \approx 2.09 \times 10^{-3}$ for the TE polarization mode. Therefore, the oscillation mode in the TM mode is placed approximately at a center between the adjacent oscillation modes in the TE mode. In this embodiment, the active layer 532 includes a multiple quantum well structure, and tensile strain is introduced into the barrier layer 523. Therefore, the gain for the TM polarization mode can be made close to the gain for the TE polarization mode, and yield as a TE/TM switching laser is greatly improved. Further, compared with a case of a bulk active layer, a large gain coefficient can be obtained by a low current density.

A modulation method for driving the laser of this embodiment is as follows. Similar to the fifth embodiment, a bias current $I_1$ is injected into the phase control region 524 of the semiconductor laser and a modulation current $\Delta I = I_1' - I_1$ is superposed on the bias current. Thereby, output light from the device is modulated or switched between the TE mode and the TM mode. The output light is processed in the same manner as the above embodiment. An optical communication system similar to the fourth embodiment can be constructed by using that modulation method.

Also in this embodiment, the signal modulation with a large extinction ratio can be obtained by a minute modulation current. Therefore, fluctuation in carrier density in the laser is small, so the chirping is reduced and the line width of oscillation spectrum is lessened. Hence, high-speed modulation can be achieved with favorable characteristics. Furthermore, since the phase can be adjusted by injecting current into the phase control region 524, the switching between the TE mode and the TM mode can be more stably effected. Moreover, yield as a TE/TM switching laser is further improved by making gains for the TE mode and the TM mode approximately equal to each other.

Eighth Embodiment

Figure 18:
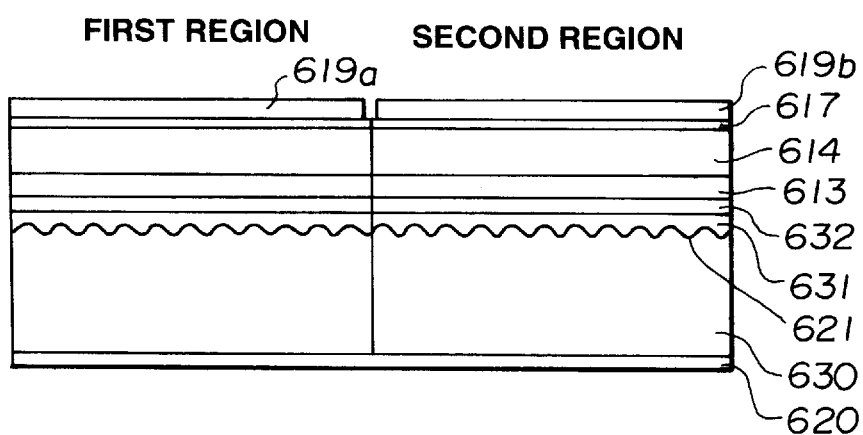
FIG. 18 is a cross-sectional view of an eighth embodiment of a semiconductor laser according to the present invention.

FIG. 18 illustrates a device of an eighth embodiment of the present invention.

First, a fabrication method of a device of the eighth embodiment will be described. A diffraction grating 621 is formed on an n-type InP substrate 630. On the wafer on which the grating 621 is formed, an n-type InGaAsP guide layer 631, an undoped($\Phi$)-InGaAsP active layer 632, a p-type InGaAsP buffer layer 613, a p-type InP clad layer 614 and a p-type InGaAsP contact layer 617 are consecutively layered in this order. Then, etching is conducted down to the substrate 630 with a mesa stripe of a width 2 $\mu$m being left, and its surroundings are buried with a p-type InP layer and an n-type InP layer (not shown). On the thus-formed wafer, p-type electrodes 619a and 619b are formed, and a common n-type electrode 620 is deposited on the bottom surface of the wafer.

First and second regions are electrically separated from each other such that those regions can be independently controlled electrically. Each of the first and second regions is 300 $\mu$m in length. Antireflection (AR) coatings (not shown) are deposited on the end facets of the device to establish a reflectance less than 0.1% thereat.

Figure 19:
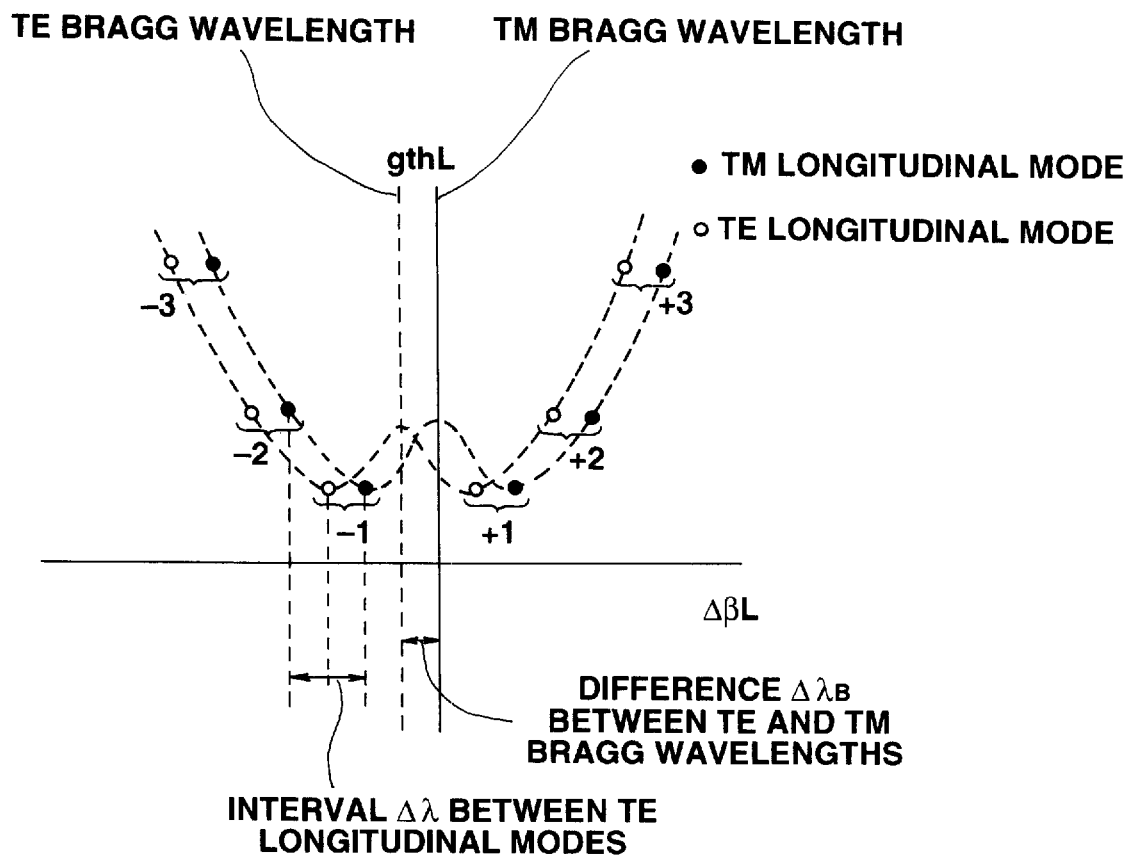
FIG. 19 is a graph illustrating the relationship between $\Delta\beta L$ and $g_{th}L$ of the eighth embodiment.

The device operates in the following manner. FIG. 19 shows the relationship between $\Delta\beta L$ and $g_{th}L$ of a DFB-LD of this embodiment. Since the waveguide of the device has different effective refractive indices for the TE mode and the TM mode, oscillation occurs at different wavelengths between the TE and the TM mode. In this embodiment, the effective refractive index is designed such that a wavelength difference between Bragg wavelength ($\lambda_{BTE}$) for the TE mode and Bragg wavelength ($\lambda_{BTM}$) for the TM mode is about a half (½) of a wavelength difference ($\Delta\lambda$) between adjacent longitudinal modes of one polarization mode.

Namely, $\lambda_{BTE} - \lambda_{BTM} \approx \Delta\lambda_{TE}/2 \ (\approx \Delta\lambda_{TM}/2)$ From this relation, $n_{TE} - n_{TM} = \Delta\lambda_{TE}/(4\Lambda) \approx 5 \times 10^{-4}$ where $n_{TE}$ is the effective index for the TE mode and $n_{Tm}$ is the effective index for the TM mode. In this embodiment, the layer structure is designed such that the difference between the effective indices for the TE mode and the TM mode is about $5 \times 10^{-4}$. Thus, the layer structure is fabricated such that the longitudinal mode of the TM mode is located near a center between adjacent longitudinal modes of the TE mode. A difference in the phase variation amount between the TE mode the TM mode in the total length of the cavity due to the difference in the effective refractive index is about $0.1\pi$, and this value does not need to be considered here.

As current injected into one of the first and second regions varies, the effective index changes and the oscillation condition varies. A simple model will be considered. First, oscillation occurs in −1 mode which is nearest to the stop band, and the threshold gain $g_{-1}$, gradually increases as the current increases. On the other hand, as the current increases, the threshold gain $g_{-2}$ of the adjacent mode decreases and the oscillation mode shifts to −2 mode. Near a place where those two modes compete, the threshold value rises and the oscillation mode is unstable. As a result, noise increases. Therefore, oscillation is likely to oscillate in the TM mode at a place where two modes of the TE mode compete and the threshold gain rises, by positioning the longitudinal mode of the TM mode near a center between the adjacent longitudinal modes of the TE mode and making gains for the TE mode and the TM mode close to each other. At the same time, the oscillation becomes stable and noise decreases.

Figure 20:
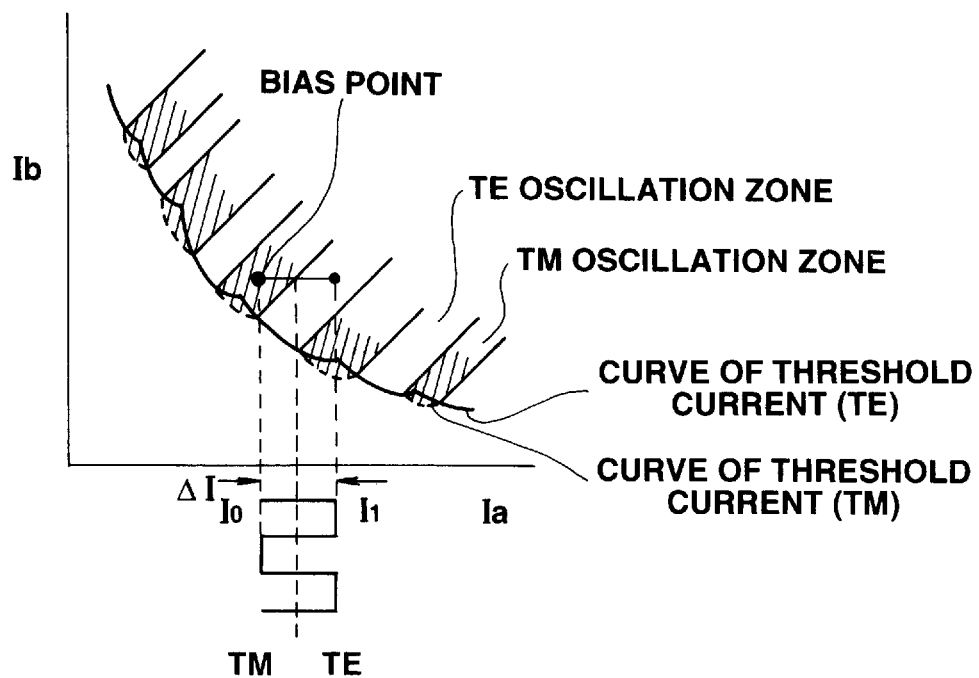
FIG. 20 is a graph illustrating the relationship between injection current and threshold gain and a modulation method of the eighth embodiment.

FIG. 20 illustrates a modulation method for driving the laser of this embodiment. A bias current $I_0$ is injected into one of the first and second regions of the semiconductor laser and a modulation current $\Delta I = I_1 - I_0$ is superposed on the bias current. Thereby, output light from the device is modulated or switched between the TE mode and the TM mode. The output light is processed in the same manner as the above embodiment. This embodiment also can be used in the structure of an optical communication system of FIGS. 10A–10D, similar to the first embodiment.

Ninth Embodiment

Figure 21:
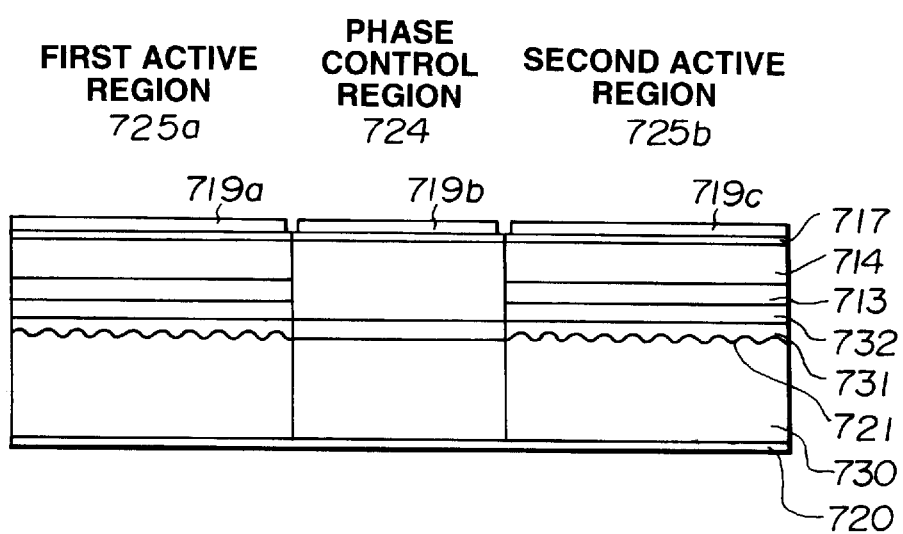
FIG. 21 is a cross-sectional view of a ninth embodiment of a semiconductor laser according to the present invention.

A ninth embodiment of the present invention will be described with reference to FIG. 21. A device of this embodiment has three regions. A central region is a phase control region 724, and regions at both opposite ends are first and second active regions 725a and 725b. The phase control region 724 lacks an active layer 732 and a grating 721. Therefore, phase and gain can be independently controlled.

Phenomenon caused by the presence of phase shift in the phase shift control region 724 is, as described in the sixth embodiment.

A fabrication method of a device will be described. The diffraction grating 721 is formed on an n-type InP substrate 730 in the active regions 725a and 725b. On the wafer on which the grating 721 is partly formed, an n-type InGaAsP guide layer 731, an undoped($\Phi$)-InGaAsP active layer 732, a p-type InGaAsP buffer layer 713, a p-type InP clad layer 714 and a p-type InGaAsP contact layer 717 are consecutively layered in this order. Then, etching is conducted down to the active layer 732 in the phase control region 724, and a p-type InP layer 714 is deposited thereon. Thereafter, another etching is conducted down to the substrate 730 with a mesa stripe of a width 2 $\mu$m being left, and its surroundings are buried with a p-type InP layer and an n-type InP layer (not shown). The active regions 725a and 725b and the phase control region 724 are electrically separated from each other such that those regions can be independently controlled electrically.

On the thus-formed wafer, p-type electrodes 719a, 719b and 719c are formed, and a common n-type electrode 720 is deposited on the bottom surface of the wafer. Each of the active regions 725a and 725b is 300 $\mu$m in length and the phase control layer 724 is 200 $\mu$m in length. Antireflection (AR) coatings (not shown) are deposited on the end facets of the device to establish a reflectance less than 0.1% thereat.

Figure 22:
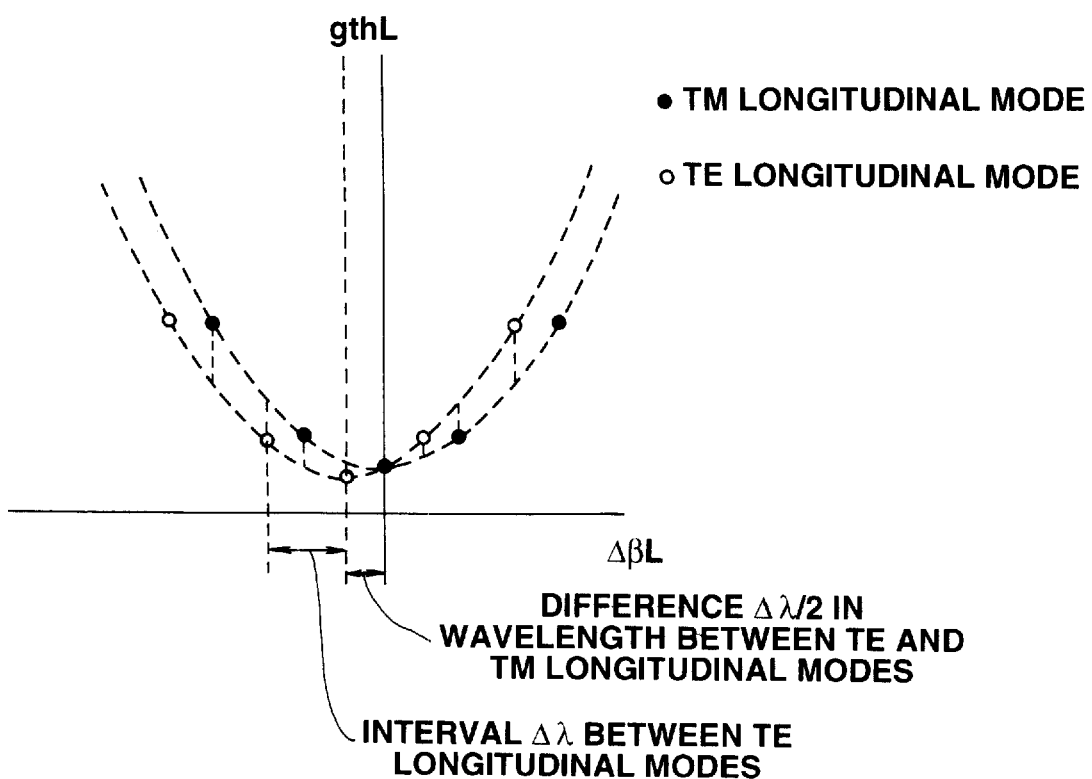
FIG. 22 is a graph illustrating the relationship between $\Delta\beta L$ and $g_{th}L$ of the ninth embodiment.

The device operates in the following manner. FIG. 22 shows the relationship between $\Delta\beta L$ and $g_{th}L$ of a DFB-LD of this embodiment. Also in this embodiment, the effective refractive index is set such that a wavelength difference between Bragg wavelength ($\lambda$BTE) for the TE polarization mode and Bragg wavelength ($\lambda$BTM) for the TM polarization mode is about a half (½) of a wavelength difference ($\Delta\lambda$)

between adjacent longitudinal modes in one polarization mode, similar to the eighth embodiment. Similar to the eighth embodiment, the layer structure is designed such that the difference between the effective indices for the TE mode and the TM mode is about $5 \times 10^{-4}$.

Oscillation is likely to oscillate in the TM mode at a place where two modes of the TE mode compete and the threshold gain rises, by positioning the longitudinal mode of the TM mode near a center between the adjacent longitudinal modes of the TE mode and making gains for the TE mode and the TM mode close to each other. At the same time, the oscillation becomes stable and noise decreases. Further, the phase shift amount can be controlled by current injected into the phase control region 724, so that the threshold gain can be lowered and the oscillation can be stabilized.

A laser of this embodiment can be modulated in the same manner as the eighth embodiment, and the laser also can be used in an optical communication system as illustrated in FIGS. 10A–10D.

Tenth Embodiment

Figure 23A:
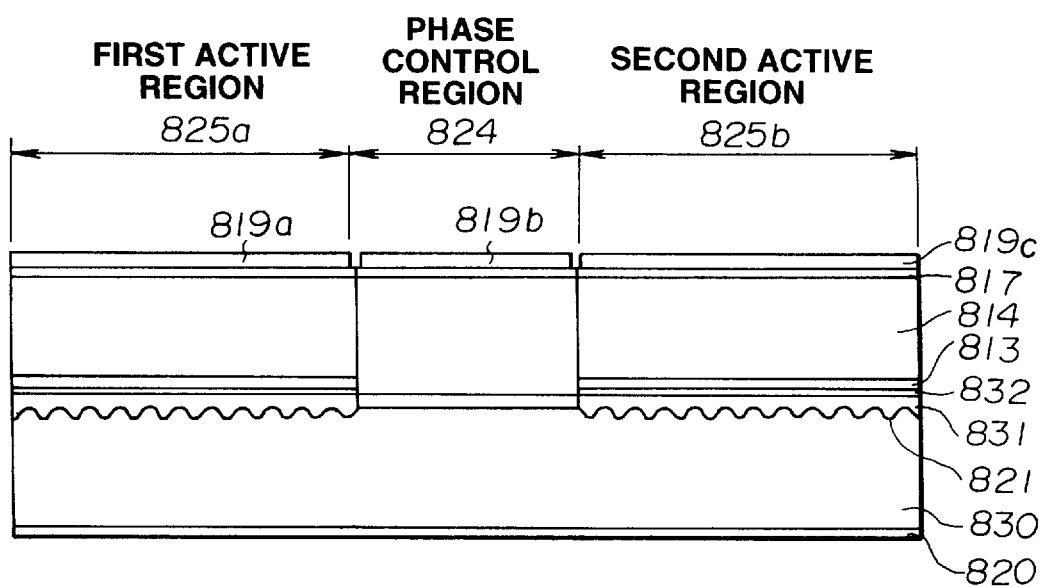
FIG. 23A is a cross-sectional view of a tenth embodiment of a semiconductor laser according to the present invention.
Figure 23B:
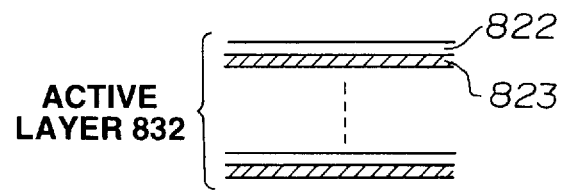
FIG. 23B is an enlarged cross-sectional view of an active layer of the tenth embodiment.

A tenth embodiment of the present invention will be described with reference to FIGS. 23A and 23B. A device of this embodiment has three regions, similar to the ninth embodiment. A central region is a phase control region 824, and regions at both opposite ends are first and second active regions 825a and 825b. The phase control region 824 lacks an active layer 832. Thus, phase and gain can be independently controlled. In this embodiment, a strained quantum well structure is introduced into the active layer 832, so that high performance of the device can be achieved.

A fabrication method of a device will be described with reference to FIGS. 23A and 23B. A diffraction grating 821 is formed on an n-type InP substrate 830. On the wafer on which the grating 821 is partly formed, an n-type InGaAsP guide layer 831, a strained quantum well active layer 832, a p-type InGaAsP buffer layer 813, a p-type InP clad layer 814 and a p-type InGaAsP contact layer 817 are consecutively grown in this order. The active layer 832 consists of ten pairs of well layers 822 and barrier layers 823, as shown in FIG. 23B. The well layer 822 is an intrinsic InGaAs having a thickness of 5 nm, and the barrier layer 823 is an intrinsic InGaAs having a thickness of 5 nm.

Then, etching is conducted down to the active layer 832 only in the phase control region 824, and a p-type InP layer 814 is layered thereon. Thereafter, etching is conducted down to the substrate 830 with a mesa stripe of a width 2 μm being left, and its surroundings are buried with a p-type InP layer and an n-type InP layer (not shown). The respective first and second active regions 825a and 825b and the phase control region 824 are electrically separated from each other such that current injected into those regions can be independently controlled. Further, p-type electrodes 819a, 819b and 819c are formed, and an n-type common electrode 820 is formed on the bottom surface of the device. Each of the first and second active regions 825a and 825b has a length of 300 μm, and the phase control region 824 has a length of 200 μm. Antireflection (AR) coatings (not shown) are deposited on the end facets of the device to establish a reflectance less than 0.1% thereat.

The device operates in the following manner. In this embodiment, the active layer 832 has a multi-quantum well structure, and strain is introduced into the barrier layer 823. Therefore, the gain for the TM polarization mode can be made close to the gain for the TE polarization mode, and yield as a TE/TM switching laser is greatly improved. Further, compared with a case of a bulk active layer, a large gain coefficient can be obtained by a low current density.

Similar to the eighth embodiment, the layer structure and the effective index are designed such that the longitudinal mode of the TM mode is positioned near a center between the adjacent longitudinal modes of the TE mode. Oscillation is likely to oscillate in the TM mode at a place where two modes of the TE mode compete and the threshold gain rises. At the same time, the oscillation becomes stable and noise decreases. Further, the phase shift amount can be controlled by current injected into the phase control region 824, so that the threshold gain can be lowered and the oscillation can be stabilized.

A laser of this embodiment can be modulated in the same manner as the eighth embodiment, and the laser also can be used in an optical communication system as illustrated in FIGS. 10A–10D, with the same technical advantages.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A semiconductor laser comprising:
   a semiconductor laser structure having a waveguide extending along a resonance direction;
   an active layer formed at least in a part of said waveguide; and
   control means for controlling the excited state of said semiconductor layer structure to adjust the relationship between respective wavelengths, or propagation constants, and threshold gains for a transverse electric (TE) mode and a transverse magnetic (TM) mode of said laser structure
   wherein the respective threshold gains for the TE mode and the TM mode alternately reach a minimum value under the control of said control means, and wherein a wavelength difference between center wavelengths of the TE and TM mode reflection spectra is equal to substantially half the wavelength difference between adjacent peak reflection wavelengths of either mode.

2. A semiconductor laser according to claim 1, comprising a reflector arranged along the resonance direction, said reflector having reflection spectral characteristics that a plurality of high reflection peaks periodically exist on both sides of a predetermined wavelength and a wavelength difference exists between center wavelengths of reflection spectra for the TE mode and the TM mode.

3. A semiconductor laser according to claim 2, wherein gains for the TE mode and the TM mode are made substantially equal to each other under the control of said control means.

4. A semiconductor laser according to claim 2, said reflector comprising a sampled grating in which a first portion with a grating and a second portion without a grating are periodically arranged alternately.

5. A semiconductor laser according to claim 2, wherein the wavelength difference between the center wavelengths of reflection spectra for the TE mode and the TM mode is approximately equal to one half of a wavelength difference between adjacent high reflection peaks for one of the TE mode and the TM mode.

6. A semiconductor laser according to claim 2, wherein a difference between effective refractive indices of said waveguide for the TE mode and the TM mode is set such that the wavelength difference between the center wavelengths of reflection spectra for the TE mode and the TM mode is approximately equal to one half of a wavelength difference between adjacent high reflection peaks for one of the TE mode and the TM mode.

7. A semiconductor laser according to claim 2, said active layer comprising a bulk layer.

8. A semiconductor laser according to claim 2, further comprising a plurality of electrically-separated regions arranged along the resonance direction, and a plurality of different kinds of reflectors are respectively arranged in said regions such that intervals between the high reflection peak wavelengths in said regions are slightly different from each other and that different oscillation polarization modes can be selected one after another due to a bernier effect between said different reflectors.

9. A semiconductor laser according to claim 2, further comprising a plurality of electrically-separated regions arranged along the resonance direction, at least one region comprising a phase control region for only controlling the phase of a light wave propagated along said waveguide, said phase control region lacking an active layer.

10. A semiconductor laser according to claim 2, said active layer comprising a strained quantum well structure into which a coaxial tensile strain is introduced.

11. A semiconductor laser according to claim 1, further comprising a plurality of electrically-separated regions arranged along the resonance direction to form a distributed feedback semiconductor laser with a diffraction grating formed along said waveguide, wherein a difference exists between phase displacement amounts in said waveguide at places close to Bragg wavelengths for the TE mode and the TM mode.

12. A semiconductor laser according to claim 11, wherein the difference between the phase displacement amounts is approximately equal to $\pi$.

13. A semiconductor laser according to claim 11, at least one of said plurality of electrically-separated regions comprising a phase control region for only controlling the phase of a light wave propagated along said waveguide, said phase control region lacking an active layer.

14. A semiconductor laser according to claim 13, wherein a difference between phase displacement amounts in said phase control region at places close to Bragg wavelengths for the TE mode and the TM mode is approximately equal to $\pi$.

15. A semiconductor laser according to claim 14, at least one of said plurality of electrically-separated regions comprising an active region which includes an active layer, and the following relation is established in said waveguide:

$$n_{2TE}/n_{1TE} - n_{2TM}/n_{1TM} \approx \Lambda/2L$$

where $n_{1TE}$ is the effective refractive index in said active region at a place close to Bragg wavelength for the TE mode, $n_{1Tm}$ is the effective refractive index in said active region at a place close to Bragg wavelength for the TM mode, $n_{2TE}$ is the effective refractive index in said phase control region at a place close to Bragg wavelength for the TE mode, $n_{2TM}$ is the effective refractive index in said phase control region at a place close to Bragg wavelength for the TM mode, $\Lambda$ is the pitch of said diffraction grating, and L is the length of said phase control region.

16. A semiconductor laser according to claim 11, said active layer comprising a bulk layer.

17. A semiconductor laser according to claim 11, said active layer comprising a strained quantum well structure into which a coaxial tensile strain is introduced.

18. A semiconductor laser according to claim 1, further comprising a plurality of electrically-separated regions arranged along the resonance direction to form a distributed feedback semiconductor laser with a diffraction grating, wherein a difference, which is smaller than an interval between adjacent longitudinal modes of one of the TE mode and the TM mode, exists between Bragg wavelengths for the TE mode and the TM mode.

19. A semiconductor laser according to claim 18, wherein the difference between Bragg wavelengths for the TE mode and the TM mode is approximately equal to one half of the interval between adjacent longitudinal modes of one of the TE mode and the TM mode.

20. A semiconductor laser according to claim 18, wherein a difference between effective refractive indices for the TE mode and the TM mode is set such that the difference between Bragg wavelengths for the TE mode and the TM mode is approximately equal to one half of the interval between adjacent longitudinal modes of one of the TE mode and the TM mode.

21. A semiconductor laser according to claim 18, wherein at least one region of the plurality of electrically-separated regions comprises a phase control region for only controlling phase of a light wave propagated along said waveguide, said phase control region lacking an active layer.

22. A semiconductor laser according to claim 18, said active layer comprising a bulk layer.

23. A semiconductor laser according to claim 18, said active layer comprising a strained quantum well structure into which a coaxial tensile strain is introduced.

24. An optical communication method for transmitting a signal from a transmitter to a receiver through an optical transmission line, said method comprising the steps of:

modulating the polarization mode of output light from a semiconductor laser between transverse electric (TE) and transverse magnetic (TM) polarization mode by controlling current injected into the semiconductor laser, the semiconductor laser comprising:

a semiconductor laser structure having a waveguide extending along a resonance direction;

an active layer formed at least in a part of said waveguide; and control means for controlling an excited state of the semiconductor laser structure to adjust a relationship between respective wavelengths and threshold gains for the TE mode and the TM mode of the laser structure, wherein the respective threshold gains for the TE mode and the TM mode alternately reach a minimum value under control of the control means, and wherein a wavelength difference between center wavelengths of the TE and TM mode reflection spectra is equal to substantially half the wavelength difference between adjacent peak reflection wavelengths of either mode;

selecting only the output light in one of the TE mode and the TM mode to create an amplitude-modulated signal; and transmitting the amplitude-modulated signal through an optical transmission line.

25. An optical communication method according to claim 24, further comprising the steps of tuning the wavelength of the amplitude-modulated signal using the semiconductor laser, and selectively detecting a signal at a desired wavelength by using a wavelength filter at a receiver side.

26. An optical communication method according to claim 25, wherein said step of selectively detecting is performed using a plurality of wavelength filters to selectively detect signals at respective desired wavelengths to perform a wavelength division multiplexing optical communication.

27. An optical communication system for transmitting a signal from a transmitter to a receiver through an optical transmission line, said system comprising:

a semiconductor laser provided in a transmitter, a polarization mode of output light from said semiconductor laser being modulated between transverse electric (TE) and transverse magnetic (TM) polarization modes by controlling current injected into said semiconductor laser, said semiconductor laser comprising:

a semiconductor laser structure having a waveguide extending along a resonance direction;

an active layer formed in at least a part of said waveguide; and control means for controlling an excited state of the semiconductor laser structure to adjust a relationship between respective wavelengths and threshold gains for the TE mode and the TM mode of the laser structure, wherein the respective threshold gains for the TE mode and the TM mode alternately reach a minimum value under control of said control means, and wherein a wavelength difference between center wavelengths of the TE and TM mode reflection spectra is equal to substantially half the wavelength difference between adjacent peak reflection wavelengths of either mode; and means for selecting only the output light in one of the TE mode and the TM mode to create an amplitude-modulated signal, the amplitude-modulated signal being transmitted from the transmitter to a receiver through an optical transmission line.

28. An optical communication system according to claim 27, wherein said semiconductor laser is designed to change the wavelength of the amplitude-modulated signal, and further comprising a wavelength filter provided in the receiver for selectively detecting a signal at a desired wavelength.

29. An optical communication system according to claim 28, further comprising a plurality of wavelength filters used to selectively detect signals at respective desired wavelengths to perform a wavelength division multiplexing optical communication.

30. A transmitter comprising:

a semiconductor laser, a polarization mode of output light from said semiconductor laser being modulated between transverse electric (TE) and transverse magnetic (TM) polarization modes by controlling current injected into said semiconductor laser, said semiconductor laser comprising:

a semiconductor laser structure having a waveguide extending along a resonance direction;

an active layer formed at least in a part of said waveguide; and control means for controlling an excited state of the semiconductor laser structure to adjust a relationship between respective wavelengths and threshold gains for the TE mode and the TM mode of the laser structure, wherein the respective threshold gains for the TE mode and the TM mode alternately reach a minimum value under the control of said control means, and wherein a wavelength difference between center wavelengths of the TE and TM mode reflection spectra is equal to substantially half the wavelength difference between adjacent peak reflection wavelengths of either mode; and means for selecting only the output light in one of the TE mode and the TM mode to create an amplitude-modulated signal.

31. A semiconductor laser comprising:

a semiconductor laser structure having a waveguide extending along a resonance direction;

an active layer formed at least in a part of said waveguide; and control means for controlling the excited state of said semiconductor laser structure to adjust the relationship between respective wavelengths, or propagation constants, and threshold gains for a transverse electric (TE) mode and a transverse magnetic (TM) mode of said laser structure, wherein the respective threshold gains for the TE mode and the TM mode alternately reach a minimum value under the control of said control means, and wherein a difference exists between a phase displacement amount of TE polarization at places close to Bragg wavelengths for TE polarization and the phase displacement amount of TM polarization at places close to Bragg wavelengths for TM polarization, the difference being approximately equal to $\pi$.

32. A semiconductor laser according to claim 31, wherein said semiconductor laser structure comprises a phase control region in which the difference between the phase displacement amounts is approximately equal to $\pi$.

33. A semiconductor laser comprising:

a semiconductor laser structure having a waveguide extending along a resonance direction;

an active layer formed at least in a part of said waveguide; and an electrode for injecting a current to said semiconductor laser structure, whereby the relationship between respective wavelengths, or propagation constants, and threshold gains for a transverse electric (TE) mode and a transverse magnetic (TM) mode of said laser structure is adjusted by controlling injected current, wherein the respective threshold gains for the TE mode and the TM mode alternately reach a minimum value, and wherein a wavelength difference between center wavelengths of the TE and TM mode reflection spectra is equal to substantially half the wavelength difference between adjacent peak reflection wavelengths of either mode.

34. A semiconductor laser comprising:

a semiconductor laser structure having a waveguide extending along a resonance direction;

an active layer formed in part of said waveguide; and an electrode for injecting a current to said semiconductor laser structure, whereby the relationship between respective wavelengths, or propagation constants, and threshold gains for a transverse electric (TE) mode and a transverse magnetic (TM) mode of said laser structure is adjusted by controlling injected current, wherein the respective threshold gains for the TE mode and the TM mode alternately reach a minimum value under the control of said injected current, and wherein a difference exists between a phase displacement amount of TE polarization at places close to Bragg wavelengths for TE polarization and the phase displacement amount of TM polarization at places close to Bragg wavelengths for TM polarization, the difference being approximately equal to $\pi$.

* * * * *

UNITED STATES PATENT AND TRADEMARK OFFICE
CERTIFICATE OF CORRECTION

PATENT NO. : 5,841,799

DATED : November 24, 1998

INVENTOR(S) : Tamayo HIROKI

Page 1 of 3

Figure 17A:
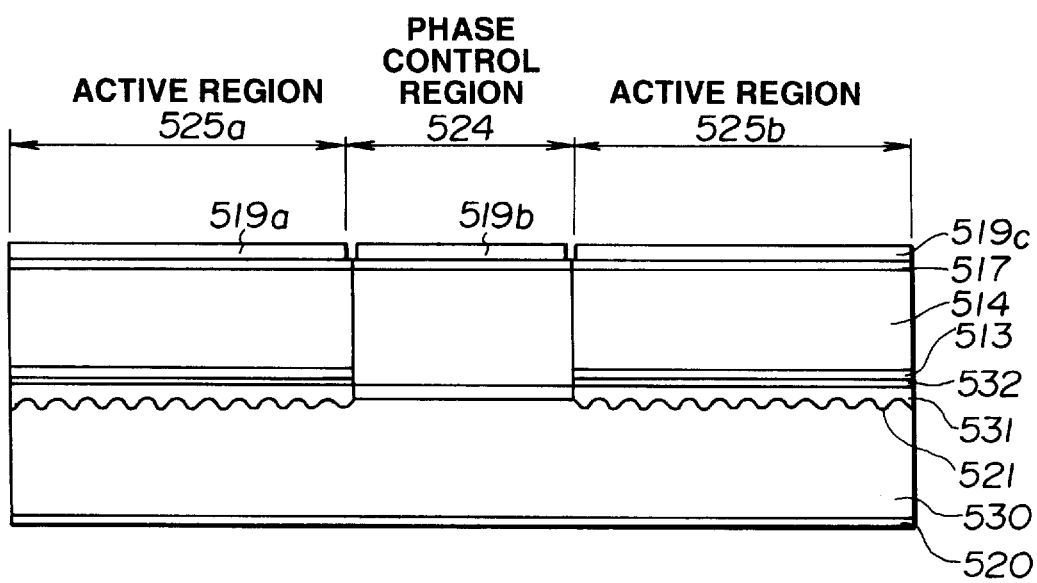
FIG. 17B is a cross-sectional view of a seventh embodiment of a semiconductor laser according to the present invention.
Figure 17B:
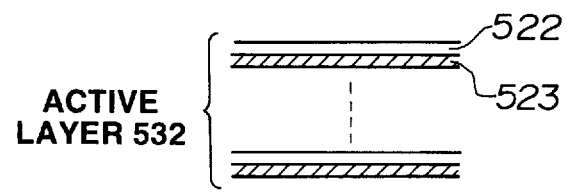

It is certified that error appears in the above-identified patent and that said Letters Patent is hereby corrected as shown below:

COLUMN 5:

Line 37, "FIG. 17B" should read --FIG. 17A--.

COLUMN 7:

Line 24, "$\lambda T^{TE02}$" should read --$\lambda^2_{TE0}$--.

COLUMN 11:

Line 23, "Î, should read --①,--.
Line 26, "lo" should read --$I_o$--.
Line 28, "2" should read --②,--.
Line 40, close up right margin.
Line 41, close up left margin.
Line 44, "n," should read --ⓝ,--.
Line 54, "characteristic" should read --characteristics--.

COLUMN 13:

Line 28, "$n_{2TM}/n_{1Tm}$" should read --$n_{2TM}/n_{1TM}$--.

UNITED STATES PATENT AND TRADEMARK OFFICE
CERTIFICATE OF CORRECTION

PATENT NO. : 5,841,799

DATED : November 24, 1998

INVENTOR(S) : Tamayo HIROKI

It is certified that error appears in the above-identified patent and that said Letters Patent is hereby corrected as shown below:

COLUMN 14:

Line 12, "$\Delta I = 1_1' - I_1$" should read --$\Delta I = I_1' - I_1$--.
Line 47, "undoped ($\Phi$)" should read --undoped ($\phi$)--.

COLUMN 17:

Line 20, "undoped ($\Phi$)" should read --undoped ($\phi$)--.
Line 53, "$n_{Tm}$" should read --$n_{TM}$--.

COLUMN 18:

Line 1, "$g_{-1}$," should read --$g_{-1}$--.
Line 41, "undoped ($\Phi$)" should read --undoped ($\phi$)--.
Line 65, "($\lambda$BTE)" should read --($\lambda_{BTE}$)--.
Line 66, "($\lambda$BTM)" should read --($\lambda_{BTM}$)--.

COLUMN 20:

Line 37, "structure" should read --structure,--.
Line 45, "comprising" should read --said wave-guide comprising--.

UNITED STATES PATENT AND TRADEMARK OFFICE
CERTIFICATE OF CORRECTION

PATENT NO. : 5,841,799

DATED : November 24, 1998

INVENTOR(S) : Tamayo HIROKI

It is certified that error appears in the above-identified patent and that said Letters Patent is hereby corrected as shown below:

COLUMN 21:

-Line 51, "$n_{1Tm}$" should read --$n_{1TM}$--.

Signed and Sealed this

Twenty-fourth Day of October, 2000

Q. TODD DICKINSON

Attest:

Attesting Officer

Director of Patents and Trademarks